(12) United States Patent
Jung

(10) Patent No.: US 10,503,414 B2
(45) Date of Patent: Dec. 10, 2019

(54) MEMORY SYSTEM AND METHOD FOR OPERATING THE MEMORY SYSTEM

(71) Applicant: SK hynix Inc., Gyeonggi-do (KR)

(72) Inventor: Won-Jin Jung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 10 days.

(21) Appl. No.: 15/408,911

(22) Filed: Jan. 18, 2017

(65) Prior Publication Data

US 2018/0059968 A1 Mar. 1, 2018

(30) Foreign Application Priority Data

Aug. 25, 2016 (KR) .................. 10-2016-0108095

(51) Int. Cl.

| G06F 12/02 | (2006.01) |
|---|---|
| G06F 3/06 | (2006.01) |
| G11C 7/20 | (2006.01) |
| G11C 5/14 | (2006.01) |
| G11C 11/56 | (2006.01) |
| G11C 16/10 | (2006.01) |
| G11C 29/24 | (2006.01) |
| G11C 29/52 | (2006.01) |
| G11C 29/00 | (2006.01) |
| G11C 16/04 | (2006.01) |
| G11C 29/44 | (2006.01) |

(52) U.S. Cl.
CPC ............ *G06F 3/0619* (2013.01); *G06F 3/064* (2013.01); *G06F 3/065* (2013.01); *G06F 3/0665* (2013.01); *G06F 3/0679* (2013.01); *G06F 3/0689* (2013.01); *G11C 5/148* (2013.01); *G11C 7/20* (2013.01); *G11C 11/5628* (2013.01); *G11C 16/10* (2013.01); *G11C 29/24* (2013.01); *G11C 29/52* (2013.01); *G11C 29/70* (2013.01); *G06F 12/0246* (2013.01); *G06F 2212/1032* (2013.01); *G06F 2212/7207* (2013.01); *G11C 16/0483* (2013.01); *G11C 2029/4402* (2013.01); *G11C 2211/5646* (2013.01)

(58) Field of Classification Search
CPC .................................................. G06F 12/0246
See application file for complete search history.

(56) References Cited

U.S. PATENT DOCUMENTS

| 7,773,415 B2 | 8/2010 | Park et al. | |
|---|---|---|---|
| 9,037,820 B2 | 5/2015 | Ratn et al. | |
| 2007/0021963 A1* | 1/2007 | Deng ................. | G06F 11/1441 711/103 |
| 2009/0109786 A1* | 4/2009 | Ye ...................... | G06F 12/0246 365/228 |
| 2011/0113183 A1* | 5/2011 | Lee .................... | G06F 12/0246 711/103 |

(Continued)

*Primary Examiner* — Edward J Dudek, Jr.
(74) *Attorney, Agent, or Firm* — IP & T Group LLP

(57) ABSTRACT

A memory system may include: a memory device including a memory cell array, the memory cell array including a plurality of scan areas, each of the plurality of scan areas including at least two group areas, each of the group areas including a flag area storing a flag that represents whether a corresponding group area is programmed or not; and a controller suitable for requesting the memory device to read the flag of each of the group areas a flag when a sudden power-off occurs, and rebuilding at least one of the group areas when at least one of the flags is in an erase state.

20 Claims, 15 Drawing Sheets

(56) References Cited

U.S. PATENT DOCUMENTS

| | | | | |
|---|---|---|---|---|
| 2013/0117496 A1* | 5/2013 | Lyubman | ............. | G11C 16/102 |
| | | | | 711/103 |
| 2013/0185609 A1* | 7/2013 | Park | ................... | G06F 11/0751 |
| | | | | 714/746 |
| 2015/0046747 A1* | 2/2015 | Gaertner | ............. | G06F 11/1666 |
| | | | | 714/6.11 |

* cited by examiner

MEMORY SYSTEM AND METHOD FOR OPERATING THE MEMORY SYSTEM

CROSS-REFERENCE TO RELATED APPLICATIONS

The present application claims priority of Korean Patent. Application No. 10-2016-0108095, filed on Aug. 25, 2016, which is incorporated herein by reference in its entirety.

BACKGROUND

1. Field

Exemplary embodiments of the present invention relate generally to a memory system for processing data in a memory device, and a method for operating the memory system.

2. Description of the Related Art

Recently, the paradigm of the computer environment is changed into a ubiquitous computing environment which allows users to get access to a computer system anywhere and anytime. For this reason, the use of portable electronic devices, such as mobile phones, digital cameras, laptop computers and the like, is surging. Portable electronic devices generally employ a memory system using a memory device as a data storage device. A data storage device may be used as a main memory device or an auxiliary memory device of a portable electronic device.

A data storage device using a memory device has excellent stability and durability because the data storage device does not include a mechanical driving unit. Also, a data storage device using a memory device is advantageous in that it may access data quickly and consume a less power. Non-limiting examples of data storage devices having these advantages include a Universal Serial Bus (USB) memory device, a memory card with diverse interfaces, a Solid-State Drive (SSD) and so forth.

A memory device may stop performing a program operation when a sudden power-off (SPO) occurs in the middle of performing a data program operation. When the power supply is resumed after the sudden power-off, the memory device may perform a rebuild operation, which is an operation of checking out how much data have been programmed in the block where the data program operation was being performed when the sudden power-off.

When rebuild operation is performed after the sudden power-off a memory device may read all the pages of the last open block and search a valid data region. Herein, if the sudden power-off occurred while programming a page disposed in the fore part of the block, the rebuild operation may be finished within a short time. However, if the sudden power-off occurred while programming a page disposed in the rear part of the block, it may take a long time to perform the rebuild operation. In these days, the technology for memory devices is advancing into high-density, high-capacity memory devices. Therefore, if the number of word lines is increased, the number of the pages that have to be read is increased as well, taking a longer time to perform the rebuild operation.

SUMMARY

Embodiments of the present invention are directed to a memory system that may perform a rebuild operation quickly after a sudden power-off, and a method for operating the memory system.

Embodiments of the present invention are directed to a memory system that may perform a rebuild operation by dividing a search area into a plurality of groups, and when the rebuild operation is performed, searching an erase group of the search area, and reading the data that are programmed in the searched erase group, and a method for operating the memory system.

In accordance with an embodiment of the present invention, a memory system may include: a memory device including a memory cell array, the memory cell array including a plurality of scan areas, each of the plurality of the scan areas including at least two group areas, each of the group areas including a flag area storing a flag that represents whether a corresponding group area is programmed or not; and a controller suitable for requesting the memory device to read the flag of each of the group areas when a sudden power-off occurs, and rebuilding at least one of the group areas when at least one of the flags is in an erase state.

The plurality of the scan areas of the memory cell array may be blocks, each of the blocks may include the group areas, and each of the group areas has a greater area than a page has.

The flag area of each of the group areas may be disposed in a last word line of the group.

When a program operation performed onto a scan area is completed for one of the group areas, the memory device may program the flag for the group for which the program operation is completed.

After a sudden power-off, the controller may search for an open block included in the memory device, obtain address information of the searched open block, and transfer a flag read command and the address information of the searched open block to the memory device.

The memory device may receive the flag read command, read flags of groups corresponding to the address information of the searched open block, and transfer flag information regarding the flags to the controller.

The controller may transfer address information of a group corresponding to a first erase-state flag among the received flag information and a read command to the memory device, and determine the data received from the memory device and rebuild a program area of the group whose programming stopped due to the sudden power-off.

The controller may control the memory device to program data continuously from a position that is lastly programmed in the open block.

The memory device may further in include a sudden power-off sensing circuit, and when a sudden power-off sensing command is received from the controller, the memory device may transfer a sensing data by the sudden power-off sensing circuit to the controller.

The sudden power-off sensing circuit may determine occurrence of a sudden power-off based on a sequence and temporal term between a word line signal and a bit line signal being shut off.

In accordance with another embodiment of the present invention, a method for operating a memory system may include: determining occurrence of a sudden power-off in a memory device that includes a memory cell array including a plurality of scan areas, each of the plurality of the scan areas including at least two group areas, each of the group areas including a flag area for storing a flag that represents whether a corresponding group area is programmed or not; receiving flags for the group areas from the memory device when a power supply is resumed after the sudden power-off; and rebuilding at least one of the group areas when at least one of the flags is in an erase-state.

The plurality of the scan areas of the memory cell array may be blocks, each of the blocks may include the group areas, and each of the group areas may have a greater area than a page has.

The flag area of each of the group areas may be disposed in a last word line of the group.

The method may further include: when a program operation performed onto a scan area is completed for one of the group areas, programming the flag for the group for which the program operation is completed.

The receiving of the flags for the group areas from the memory device when the power supply is resumed after the sudden power-off may include: searching for an open block included in the memory device where the program operation stopped, when the power supply is resumed after the sudden power-off; and reading the flags of the searched open block.

The rebuilding of the group corresponding to the erase-state flag among the read flags may include determining whether the flags are in a program state or an erase state; determining a program state of the group corresponding to a first erase-state flag among the flags; and rebuilding the group corresponding to the first erase-state flag.

The determining of the program state of the group corresponding to the erase-state flag among the read flags may further include: not scanning groups corresponding to programmed flags among the received flags.

The method may further include: programming data continuously from a position that is programmed lastly in the open block, after the rebuilding of the group corresponding to the erase-state flag among the read flags.

The method may further include: determining the occurrence of the sudden power-off through the memory device including the sudden power-off sensing circuit, wherein the determining of the occurrence of the sudden power-off through the memory device including the sudden power-off sensing circuit includes: requesting to transfer a sudden power-off sensing command to the memory device; and determining the occurrence of the sudden power-off by reading a sudden power-off sensing data that is received from the memory device.

The method may further include: determining the occurrence of the sudden power-off in a host device, wherein the memory system is a Solid-State Drive (SSD).

BRIEF DESCRIPTION OF THE DRAWINGS

The above and other features and advantages of the present invention will become more apparent to those skilled in the art to which the present invention belongs by describing in detail various embodiments thereof with reference to the attached drawings in which.

DETAILED DESCRIPTION

Figure 1:
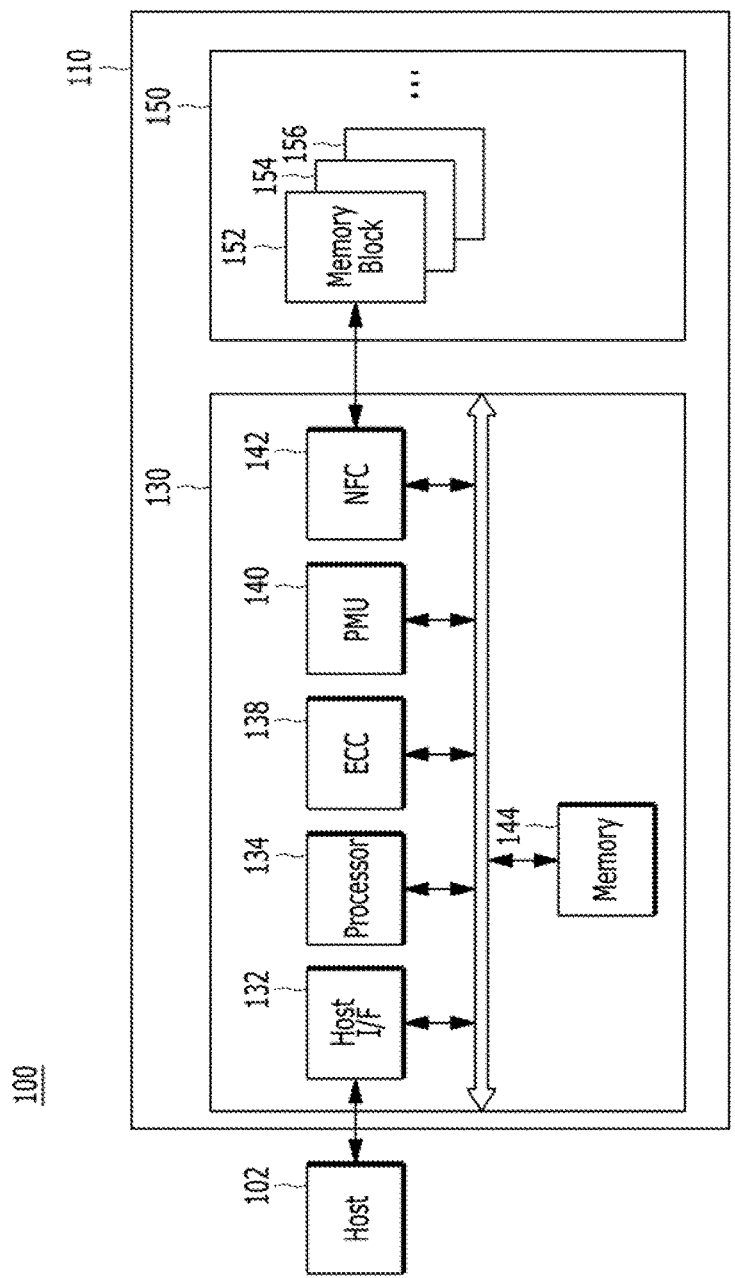
FIG. 1 is a block diagram illustrating a data processing system including a memory system, in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

Spatially relative terms, such as "under", "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in manufacturing, use or operation in addition to the orientation depicted in the figures. For example, if the device in the figures is turned over, elements described as "below" or "under" other elements or features would then be "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

FIG. 1 illustrates a data processing system 100 including a memory system 110, according to an embodiment of the present invention.

Referring to FIG. 1, the data processing system 100 may also include a host 102 operatively coupled to the memory system 110.

The host 102 may include, for example, a portable electronic device such as a mobile phone, an MP3 player and a laptop computer or an electronic device such as a desktop computer, a game player, a television (TV) and a projector.

The memory system 110 may operate in response to a request received from the host 102. For example, the memory system 110 may store data in response to a write request received from the host 102. The stored data may be accessed by the host 102 by providing a read request to the memory system 110. The memory system 110 may be used as a main memory or an auxiliary memory of the host 102. The memory system 110 may be implemented with any one of various storage devices according to the protocol of a host interface to be coupled electrically with the host 102. The memory system 110 may be implemented with any one of various storage devices such as, for example, a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like.

The storage devices forming the memory system 110 may be implemented with a volatile memory device, such as a dynamic random access memory (DRAM) and a static random access memory (SRAM) or a nonvolatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase-change RAM (PRAM), a magnetoresistive RAM (MRAM), a resistive RAM (RRAM) and a flash memory.

The memory system 110 may include a memory device 150 and a controller 130. The memory device 150 stores data to be accessed by the host 102, and the controller 130 controls data exchange between the memory device 150 and the host 102. That is, under the control of the controller 130, data received from the host 102 may be stored in the memory device 150.

The controller 130 and the memory device 150 may be integrated into one semiconductor device. For instance, the controller 130 and the memory device 150 may be integrated into one semiconductor device to form a solid state drive (SSD). When the memory system 110 is used as the SSD, the operation speed of the host 102 that is electrically coupled with the memory system 110 may be significantly increased.

The controller 130 and the memory device 150 may be integrated into one semiconductor device to form a memory card such as, for example, a Personal Computer Memory Card International Association (PCMCIA) card, a compact flash (CF) card, a smart media card (SMC) a memory stick, a multimedia card (MMC), an RS-MMC, a micro-MMC, a secure digital (SD) card, a mini-SD, a micro-SD, an SDHC, and a universal flash storage (UFS) device.

For another instance, the memory system 110 may configure a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television a digital audio recorder, a digital audio player, a digital picture recorder, a digital picture player, a digital video recorder a digital video player, a storage for a data center, a device capable of transmitting and receiving information under a wireless environment, one of various electronic devices for a home network, one of various electronic devices for a computer network, one of various electronic devices for a telematics network, an RFID device, or one of various component elements for a computing system.

The memory device 150 may retain stored data even when power is blocked, store the data provided from the host 102 during a write operation, and provide stored data to the host 102 during a read operation. The memory device 150 may include a plurality of memory blocks 152, 154 and 156. Each of the memory blocks 152, 154 and 156 may include a plurality of pages. The pages may include a plurality of memory cells and may be electrically coupled to a plurality of corresponding word lines (WL). The memory cells may be single bit cells or multi-bit cells. The memory cells may be arranged in a two or three dimensional stacked structure. The memory device 150 may be a nonvolatile memory device such as a flash memory. The flash memory may have a three-dimensional (3D) stack structure. The structure of the memory device 150 and the three-dimensional (3D)

stack structure of the memory device 150 will be described later in detail with reference to FIGS. 2 to 4.

The controller 130 of the memory system 110 may control the memory device 150 in response to a request received from the host 102. The controller 130 may provide data read from the memory device 150, to the host 102, and store data provided from the host 102 into the memory device 150. To this end, the controller 130 may control the overall operations of the memory device 150 including read, write, program, and erase operations.

For example, the controller 130 may include a host interface (I/F) unit 132, a processor 134, an error correction code (ECC) unit 138, a power management unit (PMU) 140, a NAND flash controller (NFC) 142, and a memory 144.

The host interface unit 132 may process commands and data provided from the host 102, and may communicate with the host 102 through at least one of various interface protocols such as universal serial bus (USB), multimedia card (MMC), peripheral component interconnect express (PCI-e), serial attached SCSI (SAS), serial advanced technology attachment (SATA), parallel advanced technology attachment (PATA), small computer system interface (SCSI), enhanced small disk interface (ESDI), and integrated drive electronics (IDE).

The ECC unit 138 may detect and correct errors in the data read from the memory device 150 during the read operation. The ECC unit 138 may not correct error bits when the number of the error bits is greater than or equal to a threshold number of error bits, and may output an error correction fail signal indicating a failure in correcting the error bits.

The ECC unit 138 may perform an error correction operation based on any suitable method, including, for example, a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all circuits, systems or devices for the error correction operation.

The PMU 140 may provide and manage power for the controller 130, that is, power for the component elements included in the controller 130.

The NFC 142 may serve as a memory interface between the controller 130 and the memory device 150 to allow the controller 130 to control the memory device 150 in response to a request from the host 102. The NFC 142 may generate control signals for the memory device 150 and process data under the control of the processor 134 when the memory device 150 is a flash memory and, in particular, when the memory device 150 is a NAND flash memory. Any suitable memory interface may be employed depending upon the type of the memory device 150.

The memory 144 may serve as a working memory of the memory system 110 and the controller 130, and store data for driving the memory system 110 and the controller 130. The controller 130 may control the memory device 150 in response to a request from the host 102. For example, the controller 130 may provide the data read from the memory device 150 to the host 102 and store the data provided from the host 102 in the memory device 150. When the controller 130 controls the operations of the memory device 150 such as read, write, program and erase operations, the memory 144 may store data used by the controller 130 and the memory device 150.

The memory 144 may be implemented with volatile memory such as a static random access memory (SRAM) or a dynamic random access memory (DRAM) As described above, the memory 144 may store data used by the host 102 and the memory device 150 for the read and write operations. For the storage of the data, the memory 144 may include a program memory, a data memory, a write buffer, a read buffer, a map buffer, and so forth.

The processor 134 may control the general operations of the memory system 110 including a write operation or a read operation for the memory device 150, in response to a write request or a read request from the host 102, respectively. The processor 134 may drive firmware, which is referred to as a flash translation layer (FTL), to control the general operations of the memory system 110. Any suitable processor may be employed. For example, the processor 134 may be implemented with a central processing unit (CPU). As another example, the processor 134 may be implemented with a microprocessor.

A management unit (not shown) may be included in the processor 134 for performing bad block management of the memory device 150. The management unit may find bad memory blocks included in the memory device 150, which are in unsatisfactory condition for further use, and perform bad block management on the bad memory blocks. When the memory device 150 is a flash memory, for example, a NAND flash memory, a program failure may occur during a write operation, due to characteristics of a NAND logic function. During the bad block management, the data of the program-failed memory block or the bad memory block may be programmed into a new memory block. The presence of bad blocks due to a program fail may deteriorate the utilization efficiency of the memory device 150 having a 3D stack structure and the reliability of the memory system 100, and thus a management unit may be included in the processor 134 to prevent such deterioration by performing a reliable bad block management.

Figure 2:
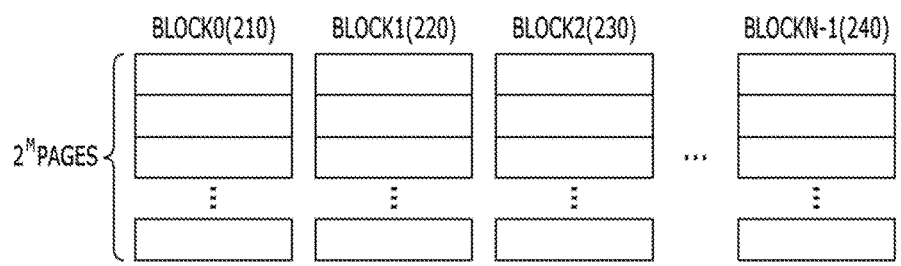
FIG. 2 illustrates a memory device in a memory system, in accordance with an embodiment of the present invention.

FIG. 2 is a detailed diagram of the memory device 150 shown in FIG. 1.

Referring to FIG. 2, the memory device 150 may include a plurality of memory blocks. For example, the memory device 150 may include a zeroth memory block (BLOCK0) 210, a first memory block (BLOCK1) 220, a second memory block (BLOCK2) 230 and an N–1$^{th}$ memory block (BLOCKN-1) 240. Each of the memory blocks 210 to 240 may include a plurality of pages, for example, $2^M$ number of pages ($2^M$ PAGES). The pages may include a plurality of memory cells and may be electrically coupled to a plurality of corresponding word lines.

The memory device 150 may include a plurality of memory blocks. The memory blocks may be single level cell (SLC) memory blocks and/or multi-level cell (MLC) memory blocks, according to the number of bits which may be stored or expressed in each memory cell. A SLC memory block may include a plurality of pages which are implemented with memory cells, each memory cell capable of storing 1-bit data. The MLC memory block may include a plurality of pages which are implemented with memory cells, each capable of storing multi-bit data, for example, two or more-bit data. An MLC memory block including a plurality of pages which are implemented with memory cells that are each capable of storing 3-bit data may be defined as a triple level cell (TLC) memory block.

Each of the memory blocks 210 to 240 may store the data provided from the host 102 during a write operation, and provide the stored data to the host 102 during a read operation.

Figure 3:
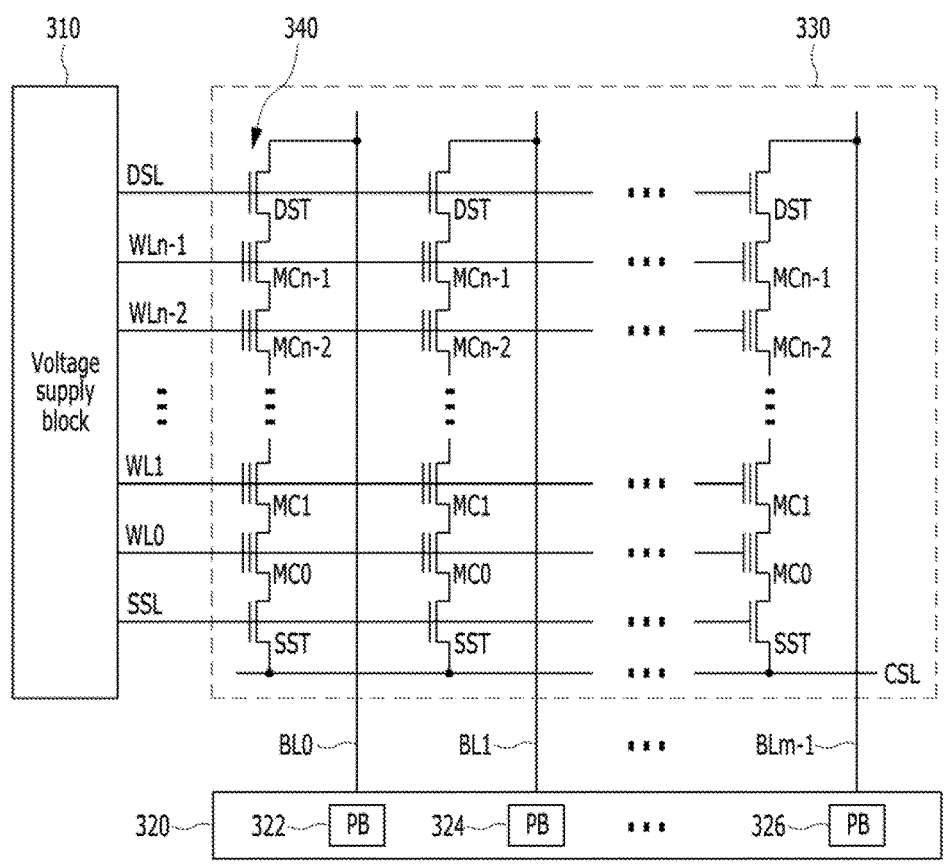
FIG. 3 is a diagram illustrating a memory cell array circuit of memory blocks in a memory device, in accordance with an embodiment of the present invention.

FIG. 3 is a diagram illustrating a memory device 150 including the memory block shown in FIG. 2. FIG. 3 shows a detailed configuration of a single memory block 330 and circuits related thereto 310 and 320.

Referring to FIG. 3, the memory block 330 may include a plurality of cell strings 340 which are electrically coupled to a plurality of respective bit lines BL0 to BLm-1. The cell string 340 of each column may include at least one drain select transistor DST and at least one source select transistor SST. A plurality of memory cell transistors MC0 to MCn-1 may be electrically coupled in series between the select transistors SST and DST. The respective memory cells MC0 to MCn-1 may be configured by multi-level cells (MLC), each of which stores data of a plurality of bits. The cell strings 340 may be electrically coupled to the corresponding bit lines BL0 to BLm-1, respectively. For reference, in FIG. 3, 'DSL' denotes a drain select line (i.e., a string select line), 'SSL' denotes a source select line (i.e., a ground select line), and 'CSL' denotes a common source line.

While FIG. 3 shows, as an example, the memory block 330 which is configured by NAND flash memory cells, it is to be noted that the memory block 330 of the memory device 300 is not limited to NAND flash memory and may be realized by NOR flash memory, hybrid flash memory in which at least two kinds of memory cells are combined, or one-NAND flash memory in which a controller is built in a memory chip. The operational characteristics of a semiconductor device may be applied to not only a flash memory device in which a charge storing layer is configured by conductive floating gates but also to a charge trap flash (CTF) in which a charge storing layer is configured by a dielectric layer.

A voltage supply block 310 of the memory device 300 may provide word line voltages, for example, a program voltage, a read voltage and a pass voltage, to be supplied to respective word lines according to an operation mode and voltages to be supplied to bulks, for example, well regions, where the memory cells are formed. The voltage supply block 310 may perform a voltage generating operation under the control of a control circuit (not shown). The voltage supply block 310 may generate a plurality of variable read voltages to generate a plurality of read data, select one of the memory blocks or sectors of a memory cell array under the control of the control circuit, select one of the word lines of the selected memory block, and provide the word line voltages to the selected word line and unselected word lines.

A read/write circuit 320 of the memory device 300 may be controlled by the control circuit, and may serve as a sense amplifier or a write driver according to an operation mode. During a verification/normal read operation, the read/write circuit 320 may serve as a sense amplifier for reading data from the memory cell array. Also, during a program operation, the read/write circuit 320 may serve as a write driver which drives bit lines according to data to be stored in the memory cell array. The read/write circuit 320 may receive data to be written in the memory cell array, from a buffer (not shown), during the program operation, and may drive the bit lines according to the inputted data. To this end, the read/write circuit 320 may include a plurality of page buffers (PBs) 322, 324 and 326 respectively corresponding to columns (or bit lines) or pairs of columns or pairs of bit lines), and a plurality of latches (not show n) may be included in each of the page buffers 322, 324 and 326.

The memory device 150 may be realized as a 2-dimensional or 3-dimensional memory device. For example, as shown in FIG. 4, in the case where the memory device 150 is realized as a 3-dimensional nonvolatile memory device, the memory device 150 may include a plurality of memory blocks BLK0 to BLKN-1.

Figure 4:
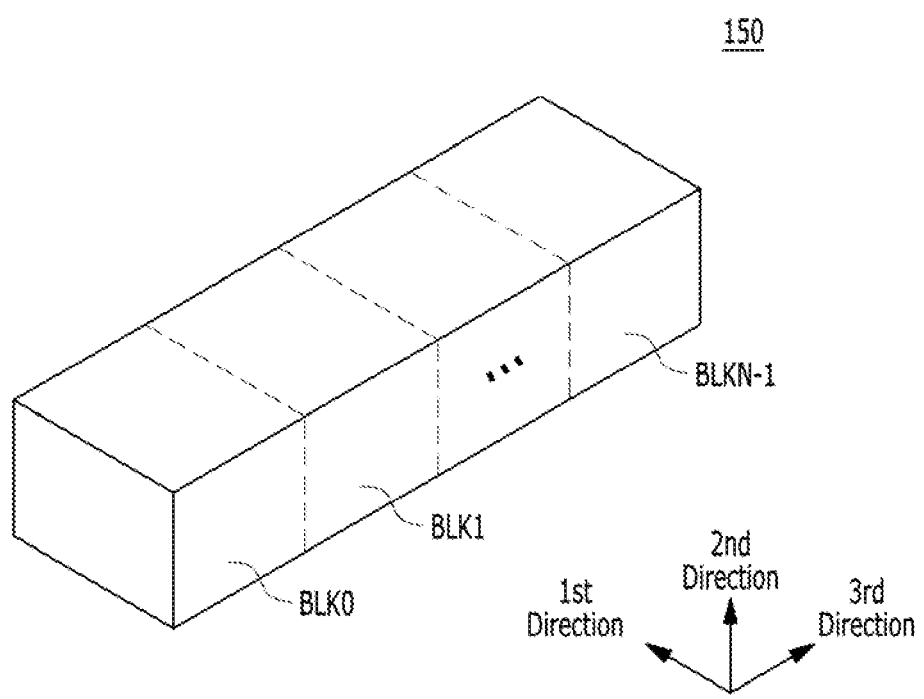
FIG. 4 illustrates a structure of a memory device in a memory system, in accordance with an embodiment of the present invention.

FIG. 4 is a block diagram illustrating the memory blocks of the memory device 150 shown in FIG. 3, and the memory blocks BLK0 to BLKN-1 may be realized as a 3-dimensional structure (or a vertical structure). For example, the respective memory blocks BLK0 to BLKN-1 may be realized as a 3-dimensional structure by including a structure which extends in first to third directions (for example, the x-axis direction, the y-axis direction and the z-axis direction).

The respective memory blocks BLK0 to BLKN-1 may Include a plurality of NAND strings extending in the second direction. The plurality of NAND strings may be provided in the first direction and the third direction. Each NAND string may be electrically coupled to a bit line, at least one drain select line at least one source select line, a plurality of word lines, at least one dummy word line, and a common source line. Namely, the respective memory blocks BLK0 to BLKN-1 may be electrically coupled to a plurality of bit lines, a plurality of drain select lines, a plurality of source select lines, a plurality of word lines, a plurality of dummy word lines, and a plurality of common source lines.

Figure 5:
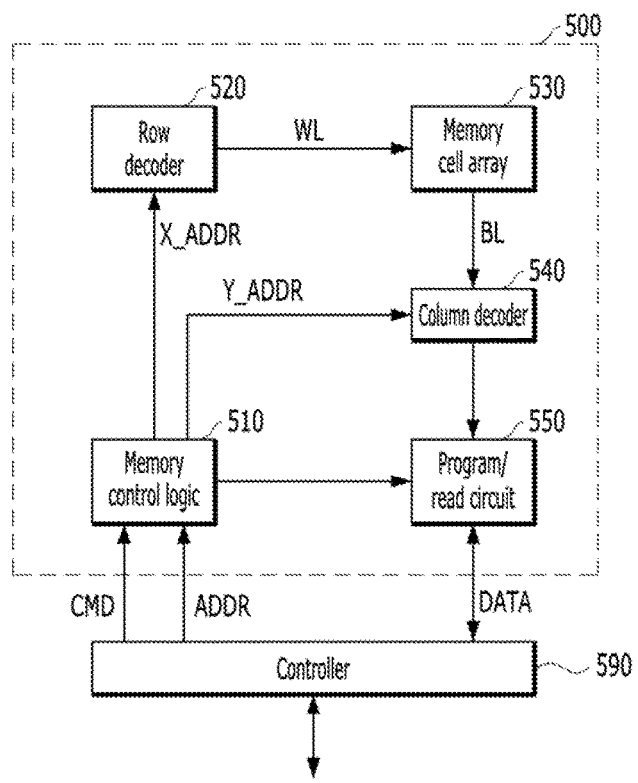
FIG. 5 is a block diagram illustrating a memory system, in accordance with an embodiment of the present invention.

FIG. 5 is a block diagram illustrating a memory system in accordance with diverse embodiments of the present invention.

Referring to FIG. 5, the memory system may include a memory device 500 and a controller 590. The memory device 500 may include a memory control logic 510, a row decoder 520, a memory cell array 530, a column decoder 540, and a program/read circuit 550.

The memory cell array 530 may be coupled to a plurality of word lines WL and a plurality of bit lines BL. Also, the memory cell array 530 may include a plurality of memory cells that are disposed in the regions where the word lines WL and the bit lines BL are intersected with each other. In operation, the memory device 500 may receive an address ADDR indicating a memory cell to be accessed. The address ADDR may include a row address X_ADDR for selecting a word line among the word lines WL of the memory cell array 530 and a column address Y_ADDR for selecting a bit line among the bit lines BL of the memory cell array 530.

The memory cell array 530 in accordance with the diverse embodiments of the present invention may include a plurality of scan areas. Each of the scan areas may include at least two group areas. Each group area may be assigned with a flag cell that may represent whether a program operation of the corresponding group area is finished or not. According to an embodiment of the present invention, the scan areas may be blocks. The group areas may be areas that are defined by grouping the word lines which are included in each block. A predetermined position of each group area may be assigned with a flag. Each group area may be the same as a page or an area that is greater than a page. In an embodiment, each group area may include a plurality of pages. When a group area includes a plurality of pages, a flag of the group area may be assigned to the last word line of the group area. The flag of a group area may be set or programmed when a program operation of programming data in the group area is finished. In the following description, it is assumed as an example that the scan areas are blocks. For example, a block may be a unit area for performing an erase operation in a memory device, and a page may be a unit area for reading and writing data. A flag may be at least one cell of the memory device 500. For example, one cell or two or more cells disposed in the last word line of a block may be assigned as a flag cell. Hereafter, a flag is referred to as a flag cell. The row decoder 520 may be coupled to the memory cell array 530 through the word lines WL and may select at least one among the word lines WL in response to the row address X_ADDR. The column decoder 540 may be coupled to the memory cell array 530 through the bit lines BL and may select at least one among the bit lines BL in response to the column address Y_ADDR.

The program/read circuit 550 may program (or write) an external data DATA received from the outside (e.g., controller 590) in the memory cell array 530. The program/read circuit 550 may also sense the data programmed in the memory cell array 530 and output the sensed data under the control of the memory control logic 510 to the outside (e.g., the controller 590). Also, the program/read circuit 550 may provide the memory control logic 510 with a program operation result or a read operation result. For example, during a program operation, the program/read circuit 550 may perform a verification operation to obtain a result of the program operation and provide the memory control logic 510 with a verification operation result, e.g., a pass signal or a failure signal. Also, in accordance with the diverse embodiments of the present invention, when the memory device 500 is in a flag cell read enable mode during a read operation, the program/read circuit 550 may read flag cell information that is programmed in the memory cell array 530 and provide the memory control logic 510 with the flag cell information.

The program/read circuit 550 may include a program circuit and a read circuit. The program circuit may be coupled to a bit line BL that is selected through the column decoder 540, and perform an operation of supplying a program pulse to a selected memory cell of the memory cell array 530, which may also be called a data write operation. The read circuit of the program/read circuit 550 may be coupled to a bit line BL that is selected through the column decoder 540, and perform an operation of sensing a level of a selected memory cell of the memory cell array 530, which may also be called a data read operation. Also, the read circuit of the program/read circuit 550 may output the data DATA that is read in a read mode to the outside of the memory device 500, for example, to the controller 590.

In accordance with the diverse embodiments of the present invention, the read circuit of the program/read circuit 550 may read the flag cell information of the memory cell array 530. When a read command is received in a read enable mode, the memory control logic 510 may perform an operation of reading the flag cell information through the read circuit of the program/read circuit 550. The flag cell information that is read by the read circuit of the program/read circuit 550 may be supplied to the memory control logic 510 and/or the controller 590.

The memory control logic 510 may output control signals for programming a data in the memory cell array 530 or reading a data from the memory cell array 530 based on a command CMD, an address ADDR, and a control signal CTRL that are transferred from the controller 590. The control signals outputted from the memory control logic 510 may be supplied to the program/read circuit 550, the row decoder 520, and the column decoder 540. The memory control logic 510 may control the general operations of the memory device 500.

More specifically, the memory control logic 510 may generate operation control signals based on the command CMD and the control signal CTRL and provide the program/read circuit 550, the row decoder 520 and the column decoder 540 with the generated operation control signals.

Also, the memory control logic 510 may provide the row decoder 520 with the row address X_ADDR and the column decoder 540 with the column address Y_ADDR. Also, the memory control logic 510 may generate a voltage control signal based on the command CMD, the control signal CTRL, and a pass/failure signal.

The controller 590 may control the data program operation and the data read operation of the memory device 500. When a program operation stops due to a sudden power-off, the controller 590, when the memory system is restarted, may search the location where the program operation stopped in the memory device 500 and controls a rebuild operation to be performed. When the rebuild operation is performed, the controller 590 may perform a flag cell read enable operation in an open block of the memory device 500. When the memory control logic 510 of the memory device 500 receives open block information and a flag cell read enable command from the controller 590, the memory control logic 510 may read the) flag cell information of the open block from the memory cell array 530 and output the flag cell information. The controller 590 may examine the received flag cell information (which is the flag cell information of a block where the program operation stopped, the last open block), detect the first erase-state group in the open block, and command the memory device 500 to read the data of the group of the open block. Subsequently, the controller 590 may perform a rebuild operation based on the data of the group that is read from the memory device 500.

The controller 590 may be a control unit of an electronic device. According to one embodiment of the present invention, the controller 590 may be a Solid-State Drive (SSD) that is coupled to a host device. The host device may be an electronic device. In an embodiment, the controller 590 may be, the controller 130 of the memory system 110 of FIG. 1.

As the technology related to the memory device 500 highly advances, the number of word lines per block may increase. If the number of word lines is increased, the time taken for performing a rebuild operation after a sudden power-off may be increased as well. For example, the time taken for the memory device 500 getting back to a ready state after a sudden power-off (which may be called a rebuild time) may go out of the specification. To solve this problem, it is required to develop a method for quickly performing a rebuild operation after a sudden power-off.

In accordance with the diverse embodiments of the present invention, the word lines included in a block of the memory cell array 530 may be grouped into N groups and a word line representing each group (e.g., the last word line) may be assigned with a flag cell.

Figure 6A:
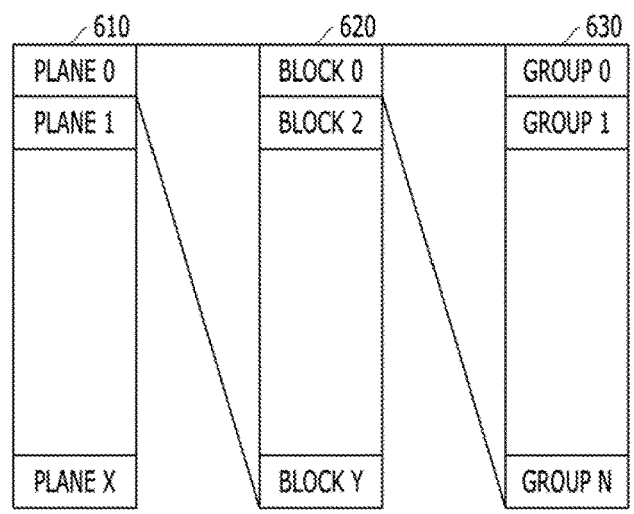
FIGS. 6A and 6B illustrate a structure of the memory device in accordance with diverse embodiments of the present invention.
Figure 6B:
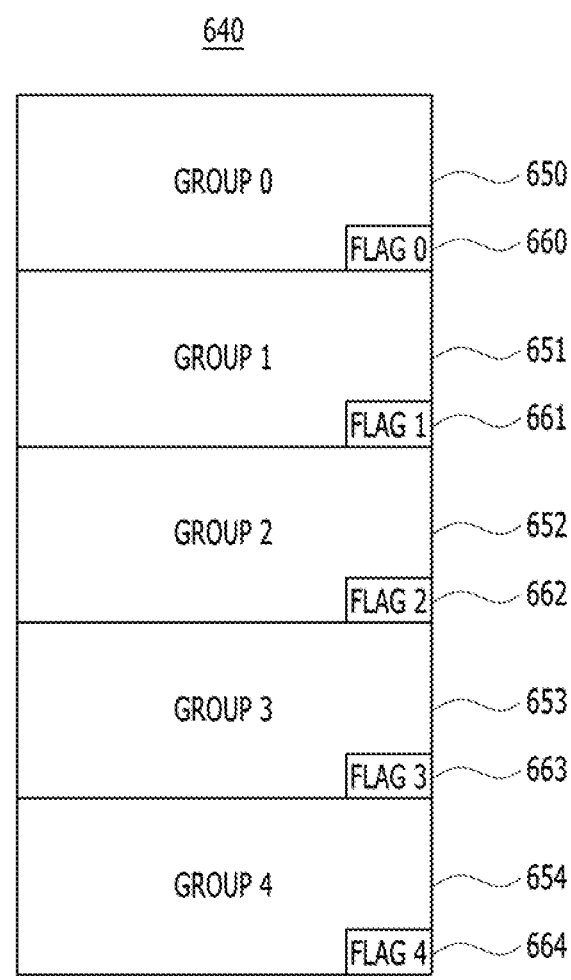

FIGS. 6A and 6B illustrate a structure of the memory device 500 in accordance pith the diverse embodiments of the present invention.

Referring to FIG. 6A, the memory cell array 530 of the memory device 500 may include a plurality of dies. Each die may include a plurality of planes PLANE 0 to PLANE X as shown in '610' of FIG. 6A, and each of the planes PLANE 0 to PLANE X may include a plurality of blocks BLOCK 0 to BLOCK Y as shown in '620' of FIG. 6A. Each block may include a plurality of pages. Each of the blocks BLOCK 0 to BLOCK Y may become a unit area for performing an erase operation on programmed data, and each of the page areas in each block may become a unit area for performing a data program operation and/or a data read operation.

Also, each of the blocks BLOCK 0 to BLOCK Y may include a plurality of groups GROUP 0 to GROUP N as shown in '630' of FIG. 6A. Each of the groups GROUP 0 to GROUP N may be set the same as a page area, or an area greater than a page area. FIG. 6B shows an example where one block 640 is grouped into 5 groups GROUP 0 650 to GROUP 4 654. The groups GROUP 0 650 to GROUP 4 654 may include flag cells 660 to 664 that may represent whether the corresponding groups are programmed or not, respectively. In each of the 5 groups GROUP 0 to GROUP 4, a flag cell may be assigned to a predetermined position of the corresponding group. FIG. 6B shows an example where the last word lines of the groups 650 to 654 are assigned with the flag cells 660 to 664, respectively. In accordance with the diverse embodiments of the present invention, a block may become a scan area, and a scan area may become a unit area for controlling a read bias level.

According to one embodiment of the present invention, when the memory device 500 receives a program command from the controller 590, the memory device 500 may program a data in the page areas of a block. When a program operation performed onto a group is finished, the memory device 500 may set a flag cell in the corresponding group to indicate a programmed group. For example, when the last word line of each group is assigned with a flag cell in the memory device 500, the flag cell may be programmed when a predetermined word line (e.g., the last word line) of the corresponding group is programmed. During a read operation, the memory device 500 may read all the flag cell information subsequent to the word line that is currently being read, and find out how many groups of the corresponding block, which is a block that is currently being read, in the order of the groups of the block are programmed.

In accordance with the diverse embodiments of the present invention, the memory system may divide the blocks of the memory device 500 into a plurality of groups by grouping the word lines, and may assign the last word line of each group with a flag cell. Then, when a rebuild operation is performed after a sudden power-off, the controller 590 may read the flag cells from the memory device 500 and find out how many groups of the block in the order of the groups are programmed. When a sudden power-off occurs, the controller 590 may check the flag cells of the groups of a block for which a program operation was interrupted due to the sudden power-off, detect a group of the first erase-state flag cell, and quickly rebuild the block.

Figure 7A:
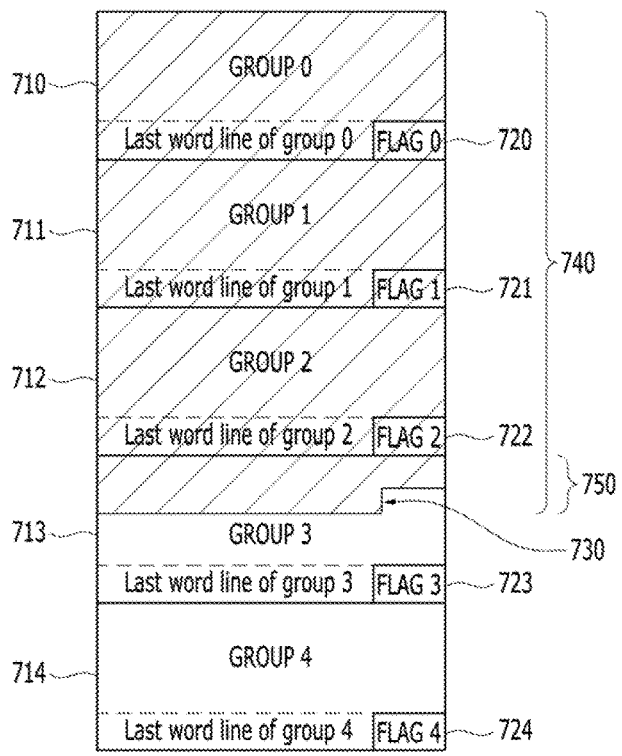
FIGS. 7A and 7B illustrate a rebuild operation of the memory system in accordance with the diverse embodiments of the present invention.
Figure 7B:
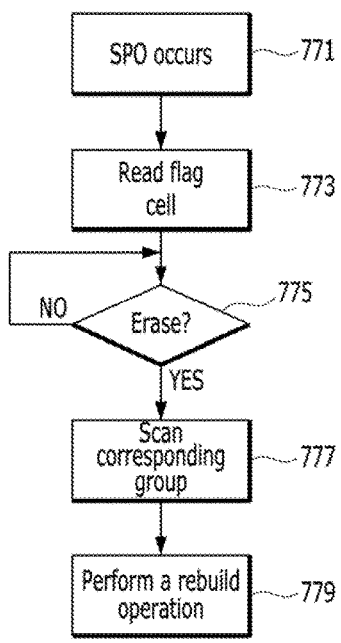

FIGS. 7A and 7B illustrate a rebuild operation of the memory system, in accordance with the diverse embodiments of the present invention.

Referring to FIG. 7A, when a sudden power-off occurs in the middle of performing a program operation, the memory system may stop the program operation. When the program operation stops due to the sudden power-off, the block of the memory cell array 530 in FIG. 5 onto which the program operation was being performed may have an open block structure as shown in FIG. 7A. FIG. 7A shows an example where one block includes five groups 710 to 714, and the groups 710 to 714 may include flag cells 720 to 724, respectively. When a block of the memory device 500 is programmed, the flag cells 720 to 722 corresponding to the groups 710 to 712 that are completed with the program operation may be in a program state, and the flag cells 723 and 724 corresponding to the groups 713 and 714 that are not completed with the program operation may be in an erase state.

When the program operation suddenly stops due to a sudden power-off, as shown in '730' of FIG. 7A, the memory system may scan the area 730 where the sudden power-off occurs and detect the location where data are programmed. In short, the memory system may scan the open block at which the program operation stopped and detect the location where the program operation is abnormally stopped, which is the area 730 where the sudden power-off occurs. The memory system does not scan the groups that are already completed with the program operation and may scan the group that is not completed with the program operation, which is the group where the sudden power-off occurred, e.g., the group 713, and perform a rebuild operation. In short, according to the method of performing a rebuild operation, when an open block is caused due to a sudden power-off, a rebuild operation is quickly performed by scanning a group having the first erase-state flag cell in the open block.

When the memory system performs a rebuild operation due to a sudden power-off, the groups that are already completed with a program operation may be found out by reading the flag cells 720 to 724 of the block. For example, as shown in FIG. 7A, the memory system may recognize that the flag cells 720 to 722 are in the program state, which may also be called a set state. In other words, the memory system may recognize the groups 710, 711 and 712 whose flag cells 720, 721 and 722, respectively, are set as the groups that are completed with the data program operation. Also, when the memory system recognizes the first erase-state flag cell 723 (which may also be called the first reset-state flag cell) in the block, the memory system may recognize the corresponding group 713 as a group that is not completed with the data program operation due to the sudden power-off. Hence, the memory system in the example of FIG. 7A may recognize the group 713 as a group that is not completed with the data program operation based on its flag cell 723 that is in the erase state, and scan the group 713 as shown in '750' of FIG. 7A, figure out the program state of the group 713, and perform a rebuild operation. In accordance with the diverse embodiments of the present invention, when an open block is caused as shown in FIG. 7A due to a sudden power-off in the middle of a program operation, the memory system need not scan all the groups of the open block as shown in '740' of FIG. 7A. Instead, the memory system may scan only the group 713 at which the program operation stopped so as to reduce the time taken for a rebuild operation.

Referring to FIG. 7B, when a sudden power-off occurs in the middle of a program operation, the memory system may recognize the occurrence of the sudden power-off in step 771. After recognizing the occurrence of the sudden power-off the memory system may read the flag cells of the open block in step 773, and detect flag cells that are in the erase state in step 775 among the flag cells that are read. After detecting the flag cells that are in the erase state, the memory system may scan the group areas corresponding to the detected flag cells in step 777, and perform a rebuild operation based on the scan result in step 779.

Therefore, when the memory system needs to perform a rebuild operation, the memory system may not have to scan all the areas where the data are programmed as shown in '740' of FIG. 7A to look for the last data of the open block (which is the data at the location of '730' of FIG. 7A). Instead, the memory system may scan the states of the flag cells to see if the corresponding flag cell is in the program state or the erase state, scan the group areas corresponding to the flag cells that are in the erase state, and perform the rebuild operation based on the scan result.

The memory system including the memory device 500 provided with the memory cell array 530 of FIG. 5 having the structure shown in FIGS. 6A and 6B may program the flag cell of a group when a program operation performed onto the group is finished while the program operation is performed. The memory system may group or divide the word lines included in one block into N groups, and assign one representative word line that may represent each group (e.g., the last word line of each group) with a flag cell that shows the state of the corresponding group. In short, the representative word line of each word line group are in the erase state in the initial stage, and then when the representative word line is programmed with data, information representing that the program operation performed onto the corresponding group is finished may be programmed together in the corresponding flag cell. When an open block is read, the memory system may read the values of the flag cells of the representative word lines of the multiple word line group and then recognize the data program state of the block based on the flag cell information that is read.

The memory system may include the memory cell array 530 of FIG. 5 having the structure shown in FIGS. 6A and 66. Each block of the memory cell array 530 may include a plurality of groups of word lines, and each group of each block may have one representative word line (e.g., the last word line) which includes a flag cell that represents whether the corresponding group is in a program state or an erase state.

The memory system may program the flag cell of a group when it performs a program operation. In short, the representative word lines of the multiple groups of a block may be in the erase state in the initial stage. When a data is written (or programmed) in the representative word line of each group, information representing that the corresponding representative word line is programmed (which is the information that the corresponding group is completed with the program operation) may be written together in the corresponding flag cell.

The memory system may rebuild the block at which the program operation stopped after the sudden power-off based on the flag cell information. When the memory system performs the rebuild operation after the sudden power-off, the memory system may detect the values of the flag cells of the representative word lines of the word line groups, and then scan the word lines to find out the words lines that are not programmed from a word line group whose representative word line is detected to have a flag cell in the erase state based on the detected values of the flag cells. So referring to the example of FIG. 7A, when the memory system performs the rebuild operation after the sudden power-off, the memory system may detect the values of the flag cells 720, 721, 722, 723 and 724 of the representative word lines of the word line groups 710, 711, 712, 713, and 714, and then scan the word lines to find out the words lines that are not programmed from word line group 713 whose representative word line is detected to have a flag cell 723 in the erase state based on the detected values of the flag cells.

Figure 8:
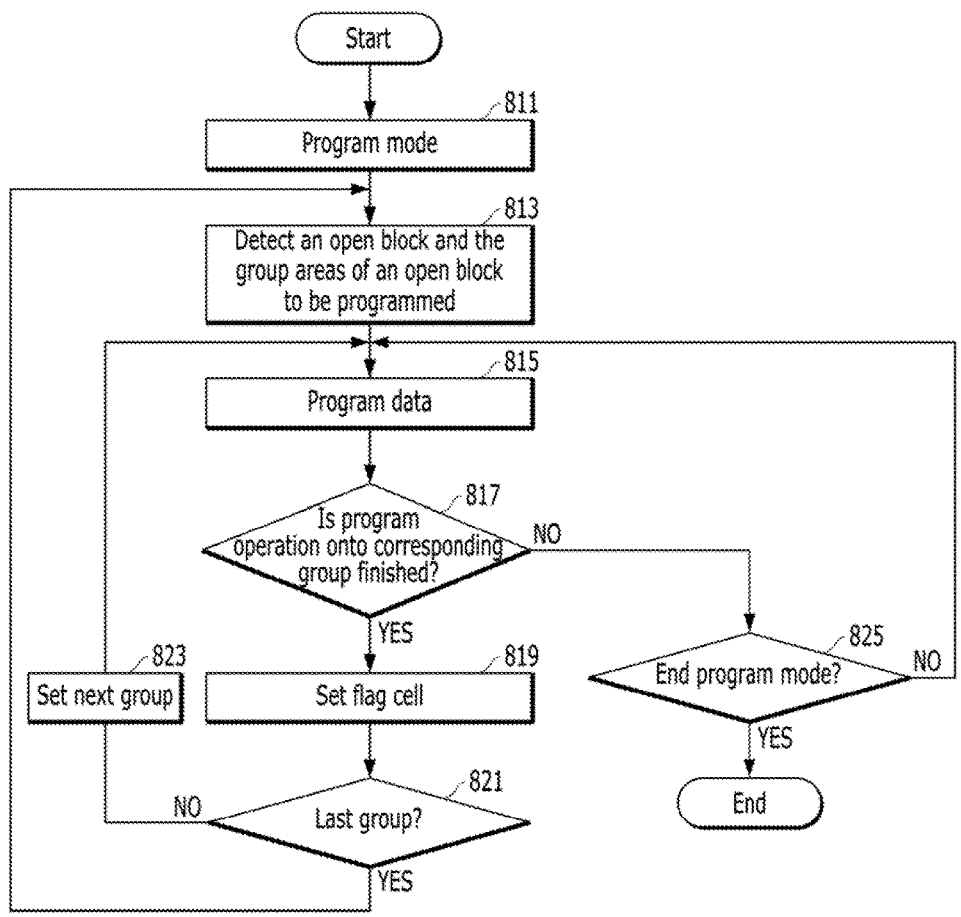
FIG. 8 is a flowchart illustrating a program operation of the memory system, in accordance with an embodiment of the present invention.

FIG. 8 is a flowchart illustrating a program operation of the memory system, in accordance with diverse embodiments of the present invention.

Referring to FIG. 8, the memory system may perform a program operation in step 811. When a program mode is requested, in step 813, the memory system may detect an open block in an open block list and detect the group areas of an open block to be programmed with data. In step 815, the memory system may program a group area of a block with data. When the program operation is performed and the group area is programmed with the data, the memory system may determine whether program operation performed onto the group area is finished in step 817. If it is determined that the program operation performed onto the group area is finished (step 817, YES), in step 819, the memory system may program the flag cell of the corresponding group. For example, when the last word line of a group area is programmed with data, the memory system may set the flag cell of the erase state that is assigned to the last word line of the group area. After the flag cell is programmed, the memory system may check out whether the corresponding group is the last group of the block in step 821. If the corresponding group is not the last group of the block (step 821, NO), the logic flow may go to step 823 and set the next group, and then go back to the step 815 to control the data program operation of the set next group.

If it turns out in the step 821 that the corresponding group is the last group of the block (step 821, YES), the logic flow may go to the step 813 to set the block completed with the data program operation as a closed block and then select the next open block. Subsequently, the memory system may check out the groups of the next open block and perform a program operation onto the groups. Also, when it is requested to stop the program operation in the middle of the program operation, the memory system may recognize the request in step 825 and stop the program operation.

As described above, the controller 590 of the memory system may detect an open block in the open block list in a program mode, and control the memory device 508 to perform a program operation onto the group areas of the open block of the memory cell array 530. Herein, when the program operation performed onto a group is finished, the memory device 500 may program the flag cell of the group (for example, the memory device 500 may set the flag cell of the erase state) to mark the completion of the program operation of the group. When the program operation is finished for all the group areas of the block, in other words, when the program operation performed onto the last group of the block is finished, the controller 590 may set the block as a closed block, and select another open block in the open block list and begin performing a program operation.

Figure 9:
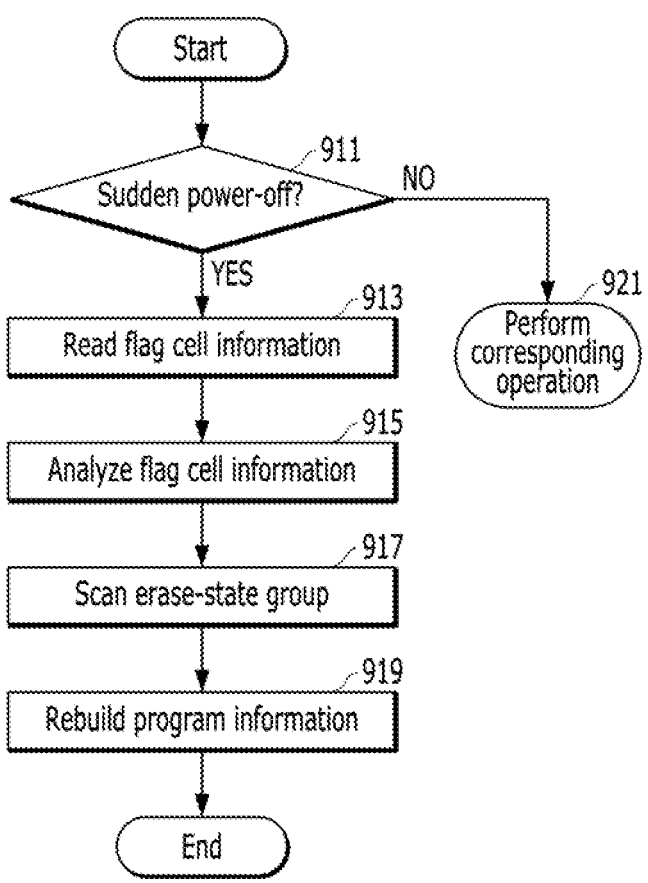
FIG. 9 is a flowchart illustrating a rebuild operation of the memory system in accordance with an embodiment of the present invention.

FIG. 9 is a flowchart illustrating a rebuild operation of the memory system in accordance with the diverse embodiments of the present invention.

Referring to FIG. 9, when the memory system recognizes the occurrence of a sudden power-off in step 911, the memory system may detect an open block and read the flag cell information of the detected open block in step 913. The open block may be a block at which the program operation stopped. The memory system may analyze the program state of the groups of the block based on the flag cell information that is read in the step 915. For example, the flag cell of a group that is completed with the program operation may have a value of a program state, while the flag cell of a group that is not completed with the data program operation may have a value of an erase state. In the group having the value of the erase state, a part of the group may be in the program state (or a part of the group may be in the erase state), or the entire area of the group may be in the erase state. The memory system may scan the data of the group having a flag cell with the erase state in step 917. Then, in step 919, the memory system may rebuild program information of the block based on the scanned data. When the number of the flag cells that are in the erase state in the step 917 is in plural, the memory system may select and scan the group corresponding to the first erase-state flag cell among the multiple flag cells (in other words, the first flag cell that is in the erase state in the block).

Figure 10:
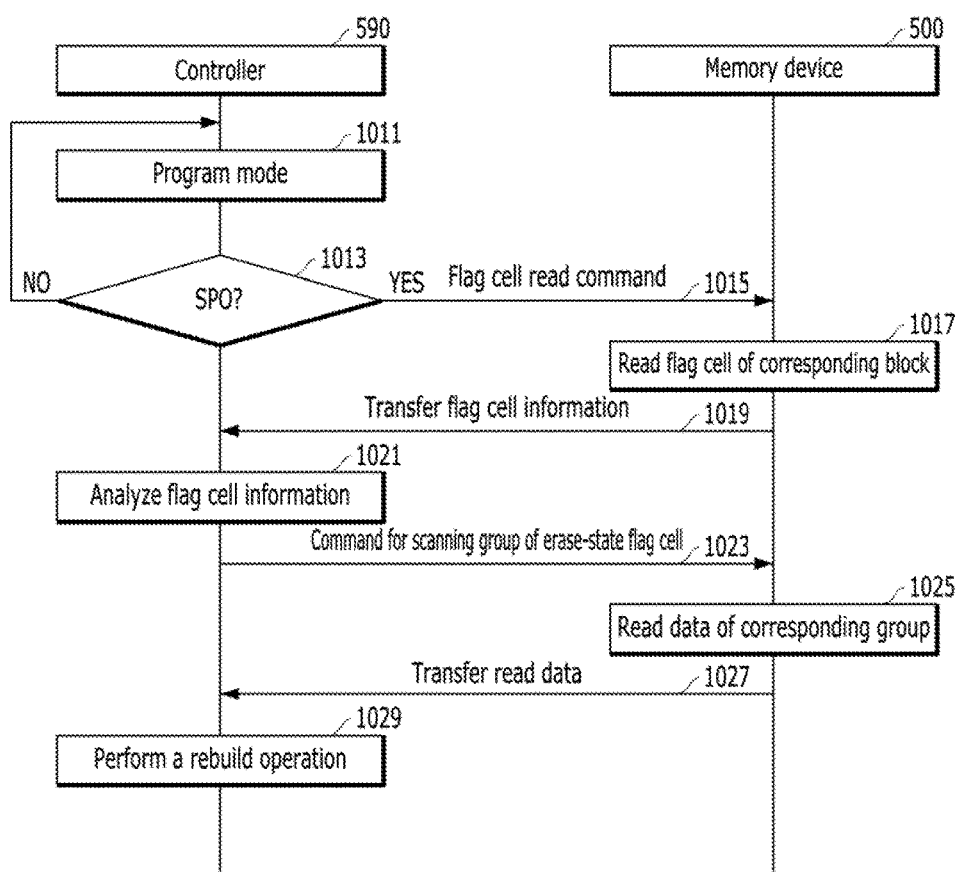
FIG. 10 is a flowchart illustrating a rebuild operation of the memory device and the controller in the memory system, in accordance with an embodiment of the present invention.

FIG. 10 is a flowchart illustrating a rebuild operation of the memory device 500 and the controller 590 in the memory system in accordance with diverse embodiments of the present invention.

Referring to FIG. 10, the controller 590 may control a program mode in step 1011. The memory device 500 may perform a program operation under the control of the controller 590 during the program mode. For example, the controller 590 and the memory device 500 of the memory system may program data in the memory cell array 530 while performing the operation shown in FIG. 8. Also, when a program operation performed onto one group of a block is finished, they may program the flag cell of the corresponding group as well.

When a sudden power-off (SPO) occurs in the middle of the program operation, the controller 590 may recognize the occurrence of the sudden power-off in step 1013. In some embodiments, the controller 590 may be a Solid-State Drive (SSD), and the controller 590 may receive information of the sudden power-off or information related to the sudden power-off from an electronic device, which may be a host device. Alternatively, the controller 590 may be a control unit of the electronic device, and the memory device 500 may be a non-volatile memory device. The memory device 500 may include a constituent element capable of sensing the sudden power-off, and the memory device 500 may transfer a sudden power-off sensing data to the controller 590 in response to a command from the controller 590.

When the controller 590 recognizes the occurrence of the sudden power-off, the controller 590 may recognize the open block in step 1015 and command the memory device 500 to read the flag cells of the open block. The open block may be a block at which the program operation stopped, and the flag cell read command may be a command for reading the flag cells assigned to a particular area of the block. According to one embodiment of the present invention, the controller 590 may be informed of the area information of the groups of each block, and also informed of the position information of the flag cell assigned to each group. In this case, the controller 590 may scan the open block, detect the address of a block to be scanned due to the sudden power-off, find out the position information of the flag cells of the open block, and transfer the position information of the flag cells to the memory device 500 along with the flag cell read command. According to one embodiment of the present invention, the memory device 500 may be informed of the address information of the flag cells assigned to the group areas of each block. In this case, when the memory device 500 receives the address information of the open block and a flag cell read command, the memory device 500 may read the information of the flag cells assigned to the open block and transfer the read information to the controller 590.

The memory device 500 that receives the flag cell read command may select the corresponding block of the memory cell array 530 based on a flag cell read command and a block information in step 1017. In the step 1017, the memory device 500 may be informed of the groups of the block selected and read flag cell information assigned to the groups (e.g., the last word line of each group). The memory device 500 may transfer the read flag cell information to the controller 590 in step 1019. The controller 590 may receive the flag cell information of the block from the memory device 500.

The controller 590 may analyze the program state of the groups that constitute the block based on the flag cell information, which are received in the step 1021. If a flag cell belongs to a group that is completed with the program operation, the flag cell may have a value of a program state. If a flag cell belongs to a group that is not completed with the program operation, the flag cell may have a value of an erase state. In the group having the value of the erase state, a part of the group may be in the program state (or a part of the group may be in the erase state), or the entire area of the group may be in the erase state. Also, among the received flag cell information, a group corresponding to the first erase-state flag cell may be a group where the program operation stopped due to the sudden power-off, and the entire area of the groups corresponding to the subsequent erase-state flag cells may be in the erase state. Therefore, the controller 590 may analyze the flag cell information in the step 1021, and the controller 590 may command the memory device 500 to scan the group corresponding to the first erase-state flag cell among the flag cell information in step 1023.

When the read command and the address information of the group are received from the controller 590, the memory device 500 may read the data of the corresponding group in step 1025 and transfer the data of the group that is read to the controller 590 in step 1027. The memory device 500 may read and transfer the programmed data if the area that is read is a programmed area. If the area that is read is not a programmed area (an erase-state area), the memory device 500 may read and transfer an erase value. The controller 590 may receive the data from the memory device 500, analyze the read data and perform a rebuild operation in step 1029.

If a sudden power-off occurs in the middle of a program operation the block that was being programmed may have the state shown in FIG. 7A. Herein, if the controller 590 commands the memory device 500 to transfer the flag cell information of the block shown in FIG. 7A, the memory device 500 may read the information of the flag cells of the block, e.g., the flag cells 720 to 724, and transfer the read information to the controller 590. The controller 590 may analyze the received flag cell information and detect the group where the program operation stopped. In FIG. 7A, the flag cells 720 to 722 may have a value of the program state, while the flag cells 723 and 724 may have a value of the erase state. When the controller 590 performs a rebuild operation, the controller 590 may scan the groups 713 and 714 corresponding to the erase-state flag cells 723 and 724 and perform the rebuild operation.

Herein, if the number of the erase-state flag cells is in plural (e.g., the flag cells 723 and 724) the group corresponding to the first erase-state flag cell (e.g., the flag cell 723) among the multiple flag cells (in other words, the first flag cell that is in the erase state in the block) may be the group where the program operation stopped due to a sudden power-off, and the group (e.g., the group 714) corresponding to the subsequent erase-state flag cell (e.g., the flag cell 724) may be a group that is not programmed, which may also be called an erase-state group. When an open block occurs due to a sudden power-off as shown in FIG. 7A, the memory system in accordance with the diverse embodiments of the present invention may scan only the group where the program operation stopped as shown in '750' of FIG. 7A based on the flag cell information of the block. In short, the memory system in accordance with the diverse embodiments of the present invention may not scan all the area of the block where the sudden power-off occurs (for example, the area '740' of FIG. 7A) but scan only the program area (e.g., '750' of FIG. 7A) of the group corresponding to an erase-state flag call (e.g., the last erase flag cell) and perform the rebuild operation.

Figure 11:
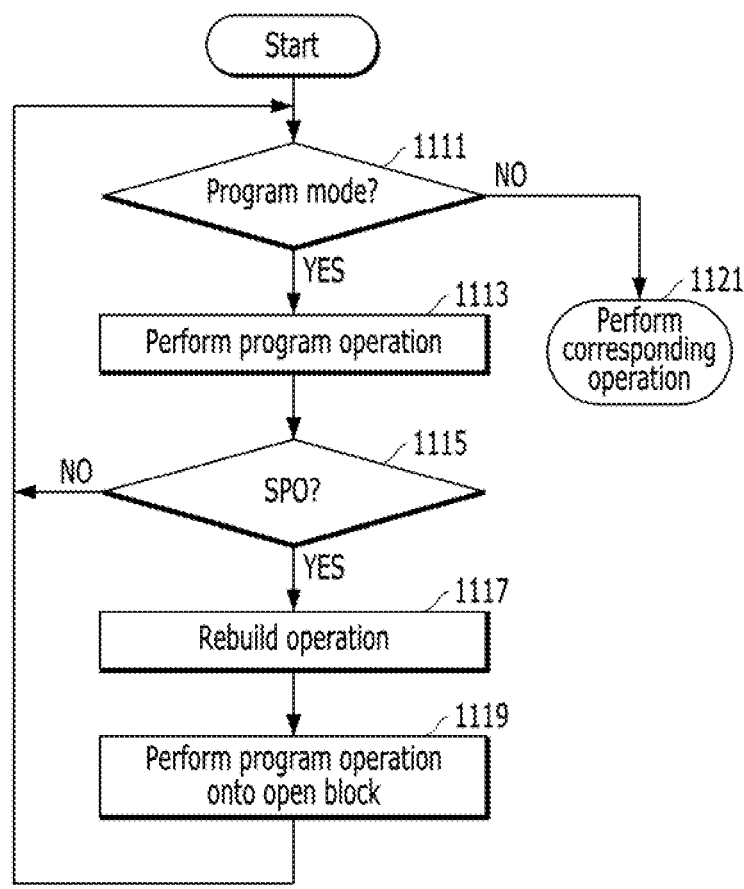
FIG. 11 is a flowchart illustrating a data program operation of the memory system, in accordance with an embodiment of the present invention.

FIG. 11 is a flowchart illustrating a data program operation of the memory system, in accordance with diverse embodiments of the present invention.

Referring to FIG. 11, when a program mode is requested, the memory system may recognize that the mode has to be changed into a program mode in step 1111. In step 1113, the memory system may perform a program operation. The program operation may be performed according to the process and method shown in FIG. 8. Herein, the memory device 500 may be a non-volatile memory device and, more particularly, a flash memory. Each block of the memory device 500 may include a plurality of pages, and a data program operation and a data read operation may be performed on the basis of a page. In accordance with diverse embodiments of the present invention, the memory device 500 may have the structure shown in FIGS. 6A and 6B. Each group of a block may be assigned with a flag cell area which represents whether the corresponding group is programmed or not. When the program operation performed on the corresponding group is finished in step 1113, the memory system may program the flag cell of the group. For example, when the data program operation performed for the last word line of the group is finished, the memory system may set the flag cell area assigned to the last word line of the group and mark the completion of the program operation.

When a sudden power-off occurs in the middle of performing the program operation through the steps 1111 and 1113, the memory system may recognize the occurrence of the sudden power-off in step 1115. When the sudden power-off occurs during the program operation, the memory device 500 may abnormally stop the program operation. Therefore, when the memory system recognizes the occurrence of the sudden power-off during the data program operation, the memory system may perform a scan operation to detect the last position programmed with data. Then when the memory system recognizes the sudden power-off (step 1115, Yes) the memory system may perform a rebuild operation in step 1117. The rebuild operation of the memory system may be performed according to the same process and method shown in FIGS. 9 and 10. In other words, when the memory system scans the block where the program operation stopped after the sudden power-off, the memory system may check out the values of the flag cells of the representative word lines of the multiple word line groups, and scan the word lines to find out the words lines that are not programmed from a word line group right ahead of the word line group whose representative word line is detected to have a flag cell in the erase state based on the values of the flag cells.

After the rebuild operation is performed in the step 1117, the memory system may resume the program operation of the block at which the data program operation stopped due to the sudden power-off. The block that is rebuilt due to the sudden power-off may be an open block. After performing the rebuild operation in the step 1117, the memory system may program the next data following the last data position that is programmed in the erase-state flag cell in step 1119. For example, after performing the rebuild operation, the controller 590 may transfer a program command, data, and address information (which is address information of the position next to the position of the data programmed before the occurrence of the sudden power-off) to the memory device 500. The memory device 500 may consecutively program data in the memory cell array 530. When the program operation performed onto the open block which is caused due to the sudden power-off is finished, the memory system may go to the step 1111 and perform a new program operation.

If the memory system is not in the program mode (NO in step 1111), the mode of the memory system may be changed into a corresponding operation mode in step 1121. The operation mode of the memory system may be a read mode and/or an erase mode. The memory system in accordance with the diverse embodiments of the present invention may supply a different read bias voltage to an open block and a closed block. When the memory system read a data of a block, the memory system may use a read bias voltage that is predetermined based on a closed block. An open block may be defined as a block that has at least some which are not programmed with data, or stated otherwise a partially programmed block. Hence an open block may have only a part of its area programmed with data. By contrast a closed block has all of its area programmed with data. Therefore, as for an open block, a read bias voltage whose level is appropriately controlled according to the distribution of the data that are programmed in the block may be supplied.

If a block is an open block, the memory system may enable a flag cell read of the memory device 500 and control the read bias voltage of the open block based on the flag cell information of the open block that are read from the memory device 500. For example, when a read command is received from the controller 590, the memory device 500 may read all the flag cells after the word line that is being read currently, and find out how many groups of the current block that is being read are programmed in the order of the groups based on the read flag cell information. The memory device 500 may control the read bias voltage of the corresponding block based on the programmed state of the current block, for example, the number of the groups of the block that are programmed. The memory device 500 may read the data of the open block based on the controlled read bias voltage.

Figure 12:
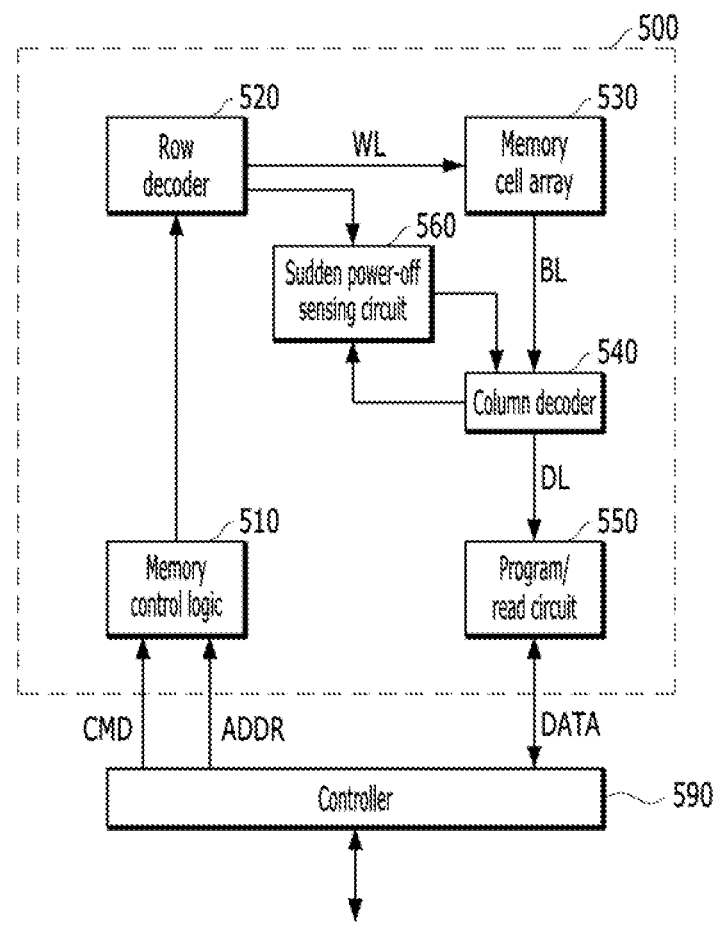
FIG. 12 is a block diagram illustrating a structure of the memory device capable of sensing a sudden power-off, in accordance with an embodiment of the present invention.

The controller 590 may recognize the occurrence of the sudden power-off from an external device, e.g., an electronic device or a host device in case of an SSD. Also, the controller 590 may recognize the occurrence of the sudden power-off from an internal device, e.g., the memory device 500. FIG. 12 is a block diagram illustrating a structure of the memory device capable of sensing a sudden power-off, in accordance with embodiments of the present invention.

Referring to FIG. 12, the memory system may include the memory device 500 and the controller 590. The memory device 500 may include the memory control logic 510, the row decoder 520, the memory cell array 530, the column decoder 540, the program/read circuit 550, and a sudden power-off sensing circuit 560.

The sudden power-off sensing circuit 560 may analyze the signals of the row decoder 520 and the signals of the column decoder 540 to detect whether a sudden power-off occurs or not. When the power supplied to the memory device 500 is cut off by the normal control of a power supply system (i.e., normal power-off) an output signal of the row decoder 520 and an output signal of the column decoder 540 that are supplied to the sudden power-off sensing circuit 560 may be generated sequentially with a predetermined temporal term between them. However, when the memory device 500 stops operating due to a sudden power-off, the signal of the row decoder 520 and the signal of the column decoder 540 applied to the sudden power-off sensing circuit 560 may be simultaneously shut off or may be generated with a very short temporal term between them. Therefore, the sudden power-off sensing circuit 560 may store different data as sensing data according to the sequence and temporal term between the inputted two different signals. Subsequently, the memory device 500 may read and output the sensing data stored in the sudden power-off sensing circuit 560 under the control of the memory control logic 510 or the controller 590. The controller 590 may decide whether a sudden power-off has occurred or not in the memory device 500 based on the sensing data outputted from the memory device 500.

Although FIG. 12 shows the sudden power-off sensing circuit 560 being disposed in the outside of the memory cell array 530, the sudden power-off sensing circuit 560 may also be implemented within the memory cell array 530 to use the memory cells. For example, the sudden power-off sensing circuit 560 may be implemented to include memory cells disposed in a spare area (not shown) of the memory cell array 530. The sudden power-off sensing circuit 560 may include a sensing cell for storing the sensing data. The sensing cell may be a memory cell disposed in the spare area of the memory cell array 530. Also, the signal of the row decoder 520 that is applied to the sudden power-off sensing circuit 560 may be included in word line signals WLs and transferred together. The signal of the column decoder 540 may be included in bit line signals BLs and transferred together. Each of the signals may be transferred to the sudden power-off sensing circuit 560 through a separate signal line (not shown) that is different from the word lines and the bit lines.

Figure 13:
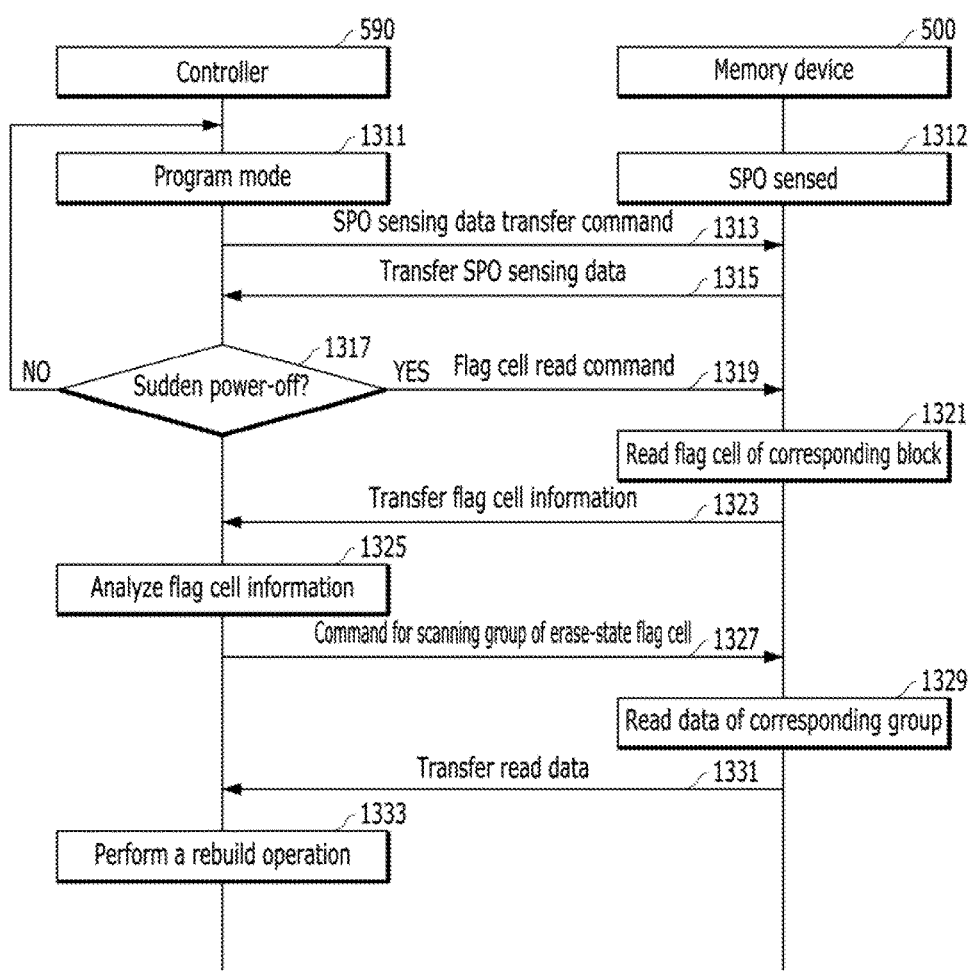
FIG. 13 is a flowchart illustrating a rebuild operation of the memory system, in accordance with an embodiment of the present invention.

FIG. 13 is a flowchart illustrating a rebuild operation of the memory system, in accordance with diverse embodiments of the present invention.

Referring to FIG. 13, in step 1311, the controller 590 may control a program operation of the memory device 500, and the memory device 500 may perform an operation of programming a data in the memory cell array 530 under the control of the controller 590. The memory device 500 may have the configuration shown in FIG. 12. In step 1312, the sudden power-off sensing circuit 560 of FIG. 12 may analyze the output of the row decoder 520 and the output of the column decoder 540 with each other so as to sense the state of power, and store the sensing result value. The sudden power-off sensing circuit 560 may store different data as sensing data according to the sequence and temporal term between the inputted two signals.)

While the memory device 500 performs a program operation, the controller 590 may request the memory device 500 to transfer the sensing data of the sudden power-off sensing circuit 560. In step 1313, when a command for transferring a sudden power-off sensing data is transferred from the controller 590 to the memory device 500, the memory device 500 may transfer the sensing data stored in the sudden power-off sensing circuit 560 to the controller 590 in step 1315. In step 1317, the controller 590 may analyze the sensing data that is received from the memory device 500 and recognize whether a sudden power-off has occurred or not. For example, if the sequence and temporal term between the two signals respectively outputted from the row decoder 520 and the column decoder 540 have an abnormal value, the controller 590 may recognize that a sudden power-off has occurred. If it is decided that a sudden power-off has occurred (step 1317, YES), the controller 590 may perform a rebuild operation by performing the processes of steps 1319 to 1333. The rebuild operation performed through the steps 1319 to 1333 may be performed in the same procedure and method as those of the rebuild operation performed in the steps 1015 to 1029 of FIG. 10, respectively.

As the technology of non-volatile memory devices highly advances, the number of word lines per block may be increased. As the number of word lines in a non-volatile memory device is increased, the time taken for a rebuild operation after a sudden power-off may be increased remarkably. In the memory system in accordance with diverse embodiments of the present invention, blocks may be grouped into a plurality of groups, and each group may be assigned with a flag cell area that represents whether a program operation of the corresponding group is finished or not. The flag cell area may be disposed in a predetermined position of each group area, such a the last word line of each group. When a program operation is not finished, the flag cell of a group of the memory device 500 may be in an erase state. When the program operation is finished, the flag cell of the group of the memory device 500 may be programmed to be in a program state. When a block where a program operation stopped after a sudden power-off is searched for in the memory system in accordance with diverse embodiments of the present invention, the values of the flag cells of the blocks are checked out to find out a group whose flag cell value is in an erase state, and then word lines that remain un-programmed are scanned from the group whose flag cell value is in the erase state to perform a rebuild operation. Also, the memory system in accordance with diverse embodiments of the present invention may continue to perform a program operation from a position where the last program operation is performed in a rebuilt open block after coming back from a sudden power-off and performing a rebuild operation.

Hereinbelow, detailed descriptions will be made with reference to FIGS. 14 to 19, for a data processing system and electronic appliances including the memory system 110, including the memory device 150 and the controller 130 described above with reference to FIGS. 1 to 13, according to various embodiments.

Figure 14:
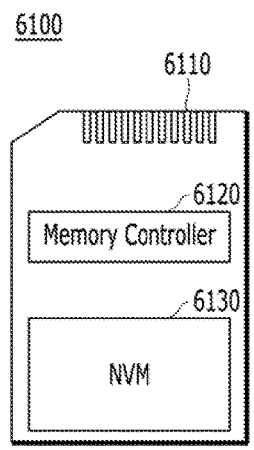
FIGS. 14 to 19 illustrate examples of a data processing system including the memory system, in accordance with diverse embodiments of the present invention.

FIG. 14 is a diagram illustrating a data processing system including a memory system according to an embodiment of the present invention. More specifically, FIG. 14, illustrates a memory card system 6100 employing a memory system.

Referring to FIG. 14, the memory card system 6100 may include a memory controller 6120, a memory device 6130, and a connector 6110.

In detail, the memory controller 6120 may be connected with the memory device 6130 and may access the memory device 6130. In some embodiments, the memory device 6130 may be implemented with a nonvolatile memory (NVM). For example, the memory controller 6120 may control read, write, erase and background operations for the memory device 6130. The memory controller 6120 may provide an interface between the memory device 6130 and a host (not shown), and may drive a firmware for controlling the memory device 6130. For example, the memory controller 6120 may correspond to the controller 130 in the memory system 110 described above with reference to FIG. 1, and the memory device 6130 may correspond to the memory device 150 in the memory system 110 described above with reference to FIG. 1.

Therefore, the memory controller 6120 may include components such as a random access memory (RAM), a processing unit, a host interface, a memory interface and an error correction unit as shown in FIG. 1.

The memory controller 6120 may communicate with an external device (for example, the host 102 described above with reference to FIG. 1), through the connector 6110. For example, as described above with reference to FIG. 1, the memory controller 6120 may be configured to communicate with the external device through at least one of various communication protocols such as universal serial bus (USB), multimedia card (MMC), embedded MMC (eMMC), peripheral component interconnection (PCI), PCI express (PCI-e), Advanced Technology Attachment (ATA), Serial-ATA, Parallel-ATA, small computer system interface (SCSI), enhanced small disk interface (ESDI), Integrated Drive Electronics (IDE), Firewire, universal flash storage (UFS), wireless-fidelity (WI-FI) and Bluetooth. Accordingly, the memory system and the data processing system according to the embodiment may be applied to wired/wireless electronic appliances, for example, a mobile electronic appliance.

The memory device 6130 may be implemented with a nonvolatile memory (NVM). For example, the memory device 6130 may be implemented with one of various nonvolatile memory devices such as an electrically erasable and programmable ROM (EPROM), a NAND flash memory, a NOR flash memory, a phase-change RAM (PRAM), a resistive RAM (ReRAM) a ferroelectric RAM (FRAM) and a spin torque transfer magnetic RAM (STT-MRAM).

The memory controller 6120 and the memory device 6130 may be integrated into a single semiconductor device. For example, the memory controller 6120 and the memory device 6130 may construct a solid state driver (SSD) by being integrated into a single semiconductor device. The memory controller 6120 and the memory device 6130 may construct a memory card such as a PC card (e.g., PCMCIA: Personal Computer Memory Card International Association) a compact flash card (CF), a smart media card (e.g., SM and SMC), a memory stick, a multimedia card (e.g., MMC, RS-MMC, MMCmicro and eMMC), an SD card (e.g., SD, miniSD, microSD and SDHC) and a universal flash storage (UFS).

Figure 15:
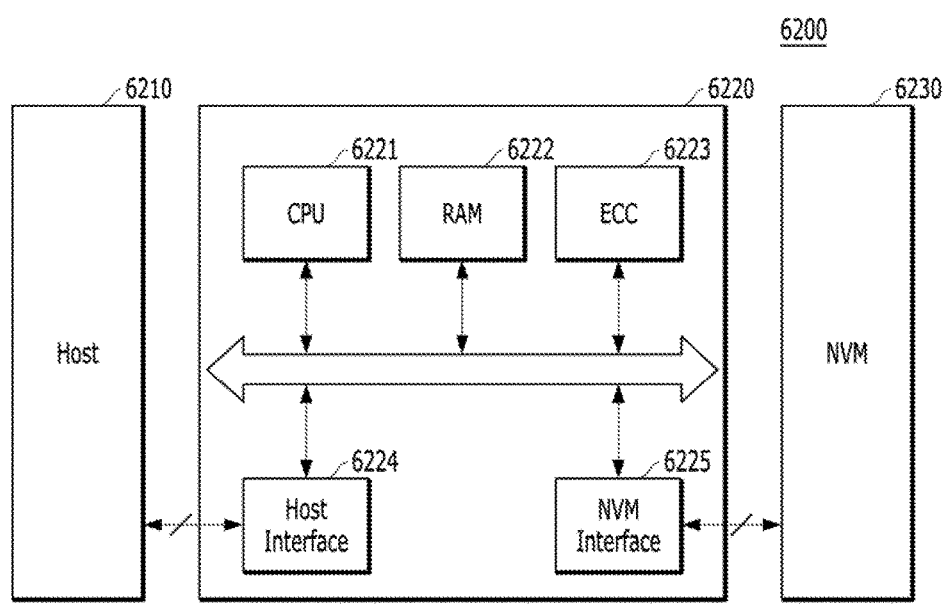

FIG. 15 is a diagram schematically illustrating another example of a data processing system 6200 including a memory system according to an embodiment of the present invention.

Referring to FIG. 15, the data processing system 6200 may include a memory device 6230 which may be implemented with at least one nonvolatile memory (NVM) and a memory controller 6220 for controlling the memory device 6230. The data processing system 6200 may be a storage medium such as a memory card (e.g., CF, SD and microSD), as described above with reference to FIG. 1. The memory device 6230 may correspond to the memory device 150 in the memory system 110 described above with reference to FIG. 1, and the memory controller 6220 may correspond to the controller 130 in the memory system 110 described above with reference to FIG. 1.

The memory controller 6220 may control the operations, including the read, write and erase operations for the memory device 6230 in response to requests received from a host 6210. The memory controller 6220 may include at least one of a central processing unit (CPU) 6221, a random access memory (RAM) as a buffer memory 6222, an error correction code (ECC) circuit 6223, a host interface 6224, and an NVM interface as a memory interface 6225, all coupled via an internal bus.

The CPU 6221 may control the operations for the memory device 6230 such as read, write, file system management, bad page management, and so forth. The RAM 6222 may operate according to control of the CPU 6221, and may be used as a work memory, a buffer memory, a cache memory, or the like. In the case where the RAM 6222 is used as a work memory, data processed by the CPU 6221 is temporarily stored in the RAM 6222. In the case where the RAM 6222 is used as a buffer memory, the RAM 6222 is used to buffer data to be transmitted from the host 6210 to the memory device 6230 or from the memory device 6230 to the host 6210. In the case where the RAM 6222 is used as a cache memory, the RAM 6222 may be used to enable the memory device 6230 with a low speed to operate at a high speed.

The ECC circuit 6223 may correspond to the ECC unit 138 of the controller 130 described above with reference to FIG. 1. As described above with reference to FIG. 1, the ECC circuit 6223 may generate an error correction code (ECC) for correcting a fail bit or an error bit in the data received from the memory device 6230. The ECC circuit 6223 may perform error correction encoding for data to be provided to the memory device 6230, and may generate data added with parity bits. The parity bits may be stored in the memory device 6230. The ECC circuit 6223 may perform error correction decoding for data outputted from the memory device 6230. At this time, the ECC circuit 6223 may correct errors by using the parity bits. For example, as described above with reference to FIG. 1, the ECC circuit 6223 may correct errors by using one of various coded modulations such as of a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM) and a Block coded modulation (BCM).

The memory controller 6220 may transmit and receive data to and from the host 6210 through the host interface 6224, and transmit and receive data to and from the memory device 6230 through the NVM interface 6225. The host interface 6224 may be connected with the host 6210 through at least one of various interface protocols such as a parallel advanced technology attachment (PATA) bus, a serial advanced technology attachment (SATA) bus, a small computer system interface (SCSI), a universal serial bus (USB), a peripheral component interconnection express (PCI-e) or a NAND interface. Further, as a wireless communication function or a mobile communication protocol such as wireless fidelity (WI-FI) or long term evolution (LTE) is implemented, the memory controller 6220 may transmit and receive data by being connected with an external device such as the host 6210 or another external device other than the host 6210. Specifically, as the memory controller 6220 is configured to communicate with an external device through at least one among various communication protocols, the memory system and the data processing system according to the embodiment may be applied to wired/wireless electronic appliances, for example, a mobile electronic appliance.

Figure 16:
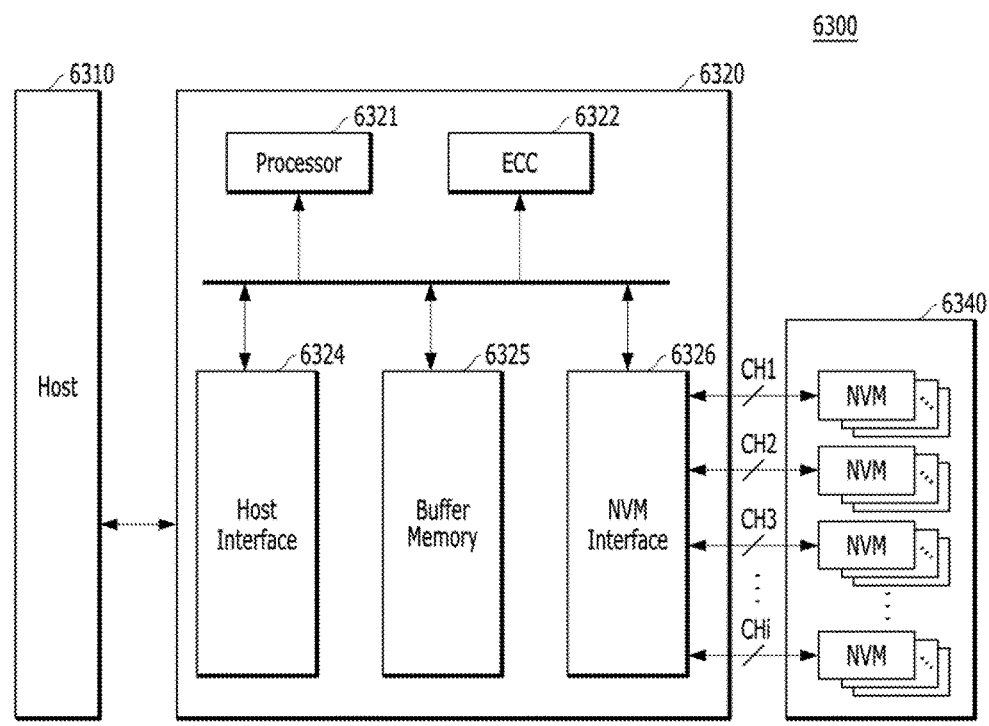

FIG. 16 is a diagram illustrating another example of a data processing system including a memory system according to an embodiment of the invention. For example, in FIG. 16, a solid state drive (SSD) 6300 employing a memory system is shown, according to an embodiment of the present invention.

Referring to FIG. 16, the SSD 6300 may include a memory device 6340 which may include a plurality of nonvolatile memories NVM and a controller 6320. The controller 6320 may correspond to the controller 130 in the memory system 110 described above with reference to FIG. 1 and the memory device 6340 may correspond to the memory device 150 in the memory system 110 described above with reference to FIG. 1.

In detail, the controller 6320 may be connected with the memory device 6340 through a plurality of channels CH1, CH2, CH3, . . . and CHi. The controller 6320 may include a processor 6321, a buffer memory 6325, an error correction code (ECC) circuit 6322, a host interface 6324, and a nonvolatile memory (NVM) interface as a memory interface 6326 coupled via an internal bus.

The buffer memory 6325 may temporarily store data received from a host 6310 or data received from a plurality of nonvolatile memories NVMs included in the memory device 6340, or temporarily store metadata of the plurality of nonvolatile memories NVMs. For example, the metadata may include map data including mapping tables. The buffer memory 6325 may be implemented with a volatile memory such as, but not limited to, a dynamic random access memory (DRAM), a synchronous dynamic random access memory (SDRAM), a double data rate (DDR) SDRAM, a low power double data rate (LPDDR) SDRAM and a graphic random access memory (GRAM) or a nonvolatile memory such as, but not limited to, a ferroelectric random access memory (FRAM), a resistive random access memory (ReRAM), a spin-transfer torque magnetic random access memory (STT-MRAM) and a phase change random access memory (PRAM). While it is illustrated in FIG. 16, for the sake of convenience in explanation, that the buffer memory 6325 is disposed inside the controller 6320, it is to be noted that the buffer memory 6325 may be disposed outside the controller 6320.

The ECC circuit 6322 may calculate error correction code values of data to be programmed in the memory device 6340 in a program operation, perform an error correction operation for data read from the memory device 6340, based on the error correction code values, in a read operation, and perform an error correction operation for data recovered from the memory device 6340 in a recovery operation for failed data.

The host interface 6324 may provide an interface function with respect to an external device such as the host 6310, The nonvolatile memory interface 6326 may provide an interface function with respect to the memory device 6340 which is connected through the plurality of channels CH1, CH2, CH3, . . . and CHi.

As a plurality of SSDs 6300 to each of which the memory system 110 described above with reference to FIG. 1 is applied are used, a data processing system such as a redundant array of independent disks (RAID) system may be implemented. In the RAID system, the plurality of SSDs 6300 and an RAID controller for controlling the plurality of SSDs 6300 may be included. In the case of performing a program operation by receiving a write command from the host 6310, the RAID controller may select at least one memory system (for example, at least one SSD 6300) in response to the RAID level information of the write command received from the host 6310, among a plurality of RAID levels (for example, the plurality of SSDs 6300) and may output data corresponding to the write command, to the selected SSD 6300. In the case of performing a read operation by receiving a read command from the host 6310 the RAID controller may select at least one memory system (for example, at least one SSD 6300) in response to the RAID level information of the write command received from the host 6310, among the plurality of RAID levels (for example, the plurality of SSDs 6300), and may provide data outputted from the selected SSD 6300, to the host 6310.

Figure 17:
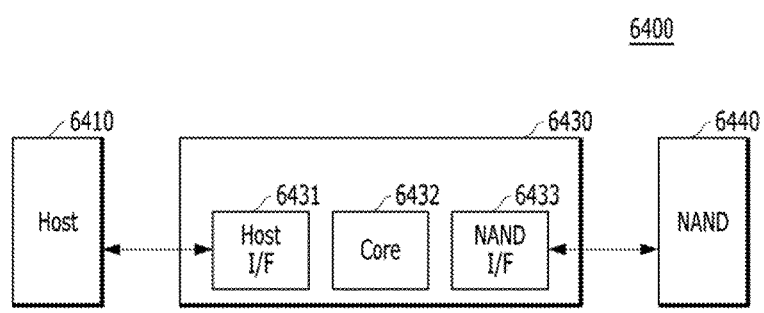

FIG. 17 is a diagram illustrating another example of a data processing system including the memory system according to an embodiment of the present invention. For example, in FIG. 17, an embedded multimedia card (eMMC) 6400 employing a memory system is shown, according to an embodiment of the present invention.

Referring to FIG. 17, the eMMC 6400 may include a memory device 6440 which is implemented with at least one NAND flash memory, and a controller 6430. The controller 6430 may correspond to the controller 130 in the memory system 110 described above with reference to FIG. 1, and the memory device 6440 may correspond to the memory device 150 in the memory system 110 described above with reference to FIG. 1.

The controller 6430 may be connected with the memory device 6440 through a plurality of channels. The controller 6430 may include a core 6432, a host interface 6431, and a memory interface such as a NAND interface 6433.

The core 6432 may control the operations of the eMMC 6400. The host interface 6431 may provide an interface function between the controller 6430 and a host 6410. The NAND interface 6433 may provide an interface function between the memory device 6440 and the controller 6430. For example, the host interface 6431 may be a parallel interface such as an MMC interface, as described above with reference to FIG. 1, or a serial interface such as an ultra-high speed class 1 (UHS-I)/UHS class 2 (UHS-II) and a universal flash storage (UFS) interface.

Figure 18:
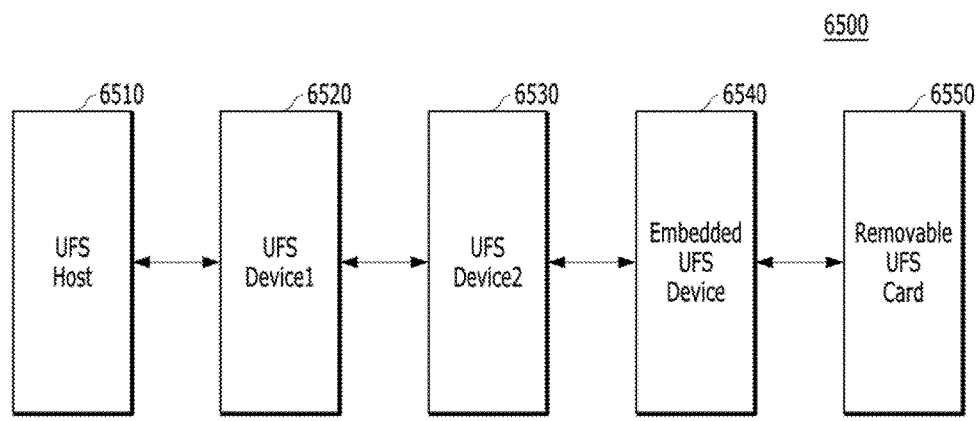

FIG. 18 is a diagram illustrating another example of a data processing system including a memory system according to an embodiment of the present invention. For example, in FIG. 18, a universal flash storage (UFS) 6500 employing the memory system is shown, according to the embodiment of the invention.

Referring to FIG. 18, the UFS system 6500 may include a UFS host 6510, a plurality of UFS devices 6520 and 6530, an embedded UFS device 6540, and a removable UFS card 6550. The UFS host 6510 may be an application processor of wired/wireless electronic appliances, for example, a mobile electronic appliance.

The UFS host 6510, the UFS devices 6520 and 6530, the embedded UFS device 6540 and the removable UFS card 6550 may respectively communicate with external devices such as wired/wireless electronic appliances (for example, a mobile electronic appliance), through a UFS protocol. The UFS devices 6520 and 6530, the embedded UFS device 6540 and the removable UFS card 6550 may be implemented with the memory system 110 described above with reference to FIG. 1, for example, as the memory card system 6100 described above with reference to FIG. 14. The embedded UFS device 6540 and the removable UFS card 6550 may communicate through another protocol other than the UFS protocol. For example, the embedded UFS device 6540 and the removable UFS card 6550 may communicate through various card protocols such as, but not limited to USB flash drives (UFDs), multimedia card (MMC), secure digital (SD), mini SD and Micro SD.

Figure 19:
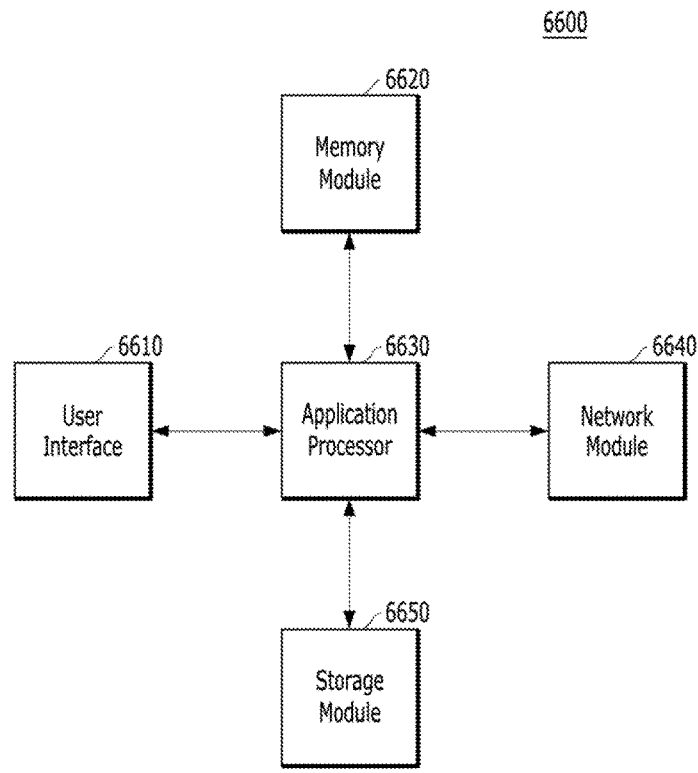

FIG. 19 is a diagram illustrating another example of a data processing system including the memory system according to an embodiment of the present invention. For example, in FIG. 19, a user system 6600 employing the memory system is shown, according to an embodiment of the present invention.

Referring to FIG. 19, the user system 6600 may include a user interface 6610, a memory module 6620, an application processor 6630, a network module 6640, and a storage module 6650.

The application processor 6630 may drive components included in the user system 6600 and an operating system (OS). For example, the application processor 6630 may include controllers for controlling the components included in the user system 6600, interfaces, graphics engines, and so on. The application processor 6630 may be provided by a system-on-chip (SoC).

The memory module 6620 may operate as a main memory, a working memory, a buffer memory or a cache memory of the user system 6600. The memory module 6620 may include a volatile random access memory such as a dynamic random access memory (DRAM), a synchronous dynamic random access memory (SDRAM), a double data rate (DDR) SDRAM, a DDR2 SDRAM, a DDR3 SDRAM, low power double data rate PDDR) SDRAM, an LPDDR2 SDRAM and an LPDDR3 SDRAM or a nonvolatile random access memory such as a phase change random access memory (PRAM), a resistive random access memory (ReRAM), a magnetic random access memory (MRAM) and a ferroelectric random access memory (FRAM). For example, the application processor 6630 and the memory module 6620 may be mounted by being packaged on the basis of a package-on-package (POP).

The network module 6640 may communicate with external devices. For example, the network module 6640 may support not only wired communications but also various wireless communications such as code division multiple access (CDMA), global system for mobile communication (GSM), wideband CDMA (WCDMA), CDMA-2000, time division multiple access (TDMA), long term evolution (LTE), worldwide interoperability for microwave access (WiMAX), wireless local area network (WLAN), ultrawideband (UWB), Bluetooth, wireless display (WI-DI), and so on, and may thereby communicate with wired/wireless electronic appliances. For example, a mobile electronic appliance. Accordingly, the memory system and the data processing system according to the embodiment may be applied to wired/wireless electronic appliances. The network module 6640 may be included in the application processor 6630.

The storage module 6650 may store data such as data received from the application processor 6530, and transmit data stored therein, to the application processor 6530. The storage module 6650 may be implemented by a nonvolatile semiconductor memory device such as a phase-change RAM (PRAM), a magnetic RAM (MRAM), a resistive RAM (ReRAM), a NAND flash memory, a NOR flash memory and a 3-dimensional NAND flash memory. The storage module 6650 may be provided as a removable storage medium such as a memory card of the user system 6600 and an external drive. For example, the storage module 6650 may correspond to the memory system 110 described above with reference to FIG. 1, and may be implemented with the SSD, eMMC and UFS described above with reference to FIGS. 16 to 18.

The user interface 6610 may include interfaces for inputting data or commands to the application processor 6630 or for outputting data to an external device. For example, the user interface 6610 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, a light emitting diode (LED), a speaker and a motor.

In the case where the memory system 110 described above with reference to FIG. 1 is applied to the mobile electronic appliance of the user system 6600 according to an embodiment, the application processor 6630 may control the operations of the mobile electronic appliance, and the network module 6640 as a communication module may control wired/wireless communication with an external device, as described above. The user interface 6610 as the display/ touch module of the mobile electronic appliance displays data processed by the application processor 6630 or supports input of data from a touch panel. According to the diverse embodiments of the present invention, when a sudden power-off occurs in the middle of performing a program operation, a memory system may quickly find out which word line among a plurality of word lines included in a program target memory block was being programmed during the program operation when the sudden power-off occurred. In this way, it is possible to drastically reduce the time taken for a rebuild operation (i.e., rebuild time) which is performed after the sudden power-off.

While the present invention has been described with respect to the specific embodiments, it will be apparent to those skilled in the art that various changes and modifications may be made without departing from the spirit and scope of the invention as defined in the following claims.

What is claimed is:

1. A memory system, comprising:
a memory device including a memory cell array, the memory cell array including a plurality of scan areas, each of the plurality of the scan areas including at least two group areas, each including plural pages and a single flag area storing a flag that represents whether the plural pages of each of the group areas are programmed or not, wherein the flag is set when a program operation onto the plural pages of each of the group areas is completed; and
a controller suitable for requesting the memory device to read the flag of each of the group areas after a sudden power-off occurs, searching which flag is in an erase state, and starting a rebuilding operation from at least one of the group areas, which includes an erase-state flag,
wherein the controller scans only the group area at which the program operation stopped among the plurality of scan areas so as to reduce the time taken for a rebuild operation.

2. The memory system of claim 1, wherein the plurality of the scan areas of the memory cell array are blocks, and each of the blocks includes the group areas.

3. The memory system of claim 2, wherein the single flag area of each of the group areas is disposed in a last word line of the group.

4. The memory system of claim 2, wherein when a program operation performed onto a scan area is completed for one of the group areas, the memory device programs the flag for the group for which the program operation is completed.

5. The memory system of claim 4, wherein after a sudden power-off, the controller searches for an open block included in the memory device, obtains address information of the searched open block, and transfers a flag read command and the address information of the searched open block to the memory device.

6. The memory system of claim 5, wherein the memory device receives the flag read command, reads flags of groups corresponding to the address information of the searched open block, and transfers flag information regarding the flags to the controller.

7. The memory system of claim 6, wherein the controller transfers address information of a group corresponding to a first erase-state flag among the received flag information and a read command to the memory device, and determines the data received from the memory device and rebuilds a program area of the group whose programming stopped due to the sudden power-off.

8. The memory system of claim 7, wherein the controller controls the memory device to program data continuously from a position that is lastly programmed in the open block.

9. The memory system of claim 3, wherein the memory device further includes a sudden power-off sensing circuit, and when a sudden power-off sensing command is received from the controller, the memory device transfers a sensing data by the sudden power-off sensing circuit to the controller.

10. The memory system of claim 9, wherein the sudden power-off sensing circuit determines occurrence of a sudden power-off based on a sequence and temporal term between a word line signal and a bit line signal being shut off.

11. A method for operating a memory system, comprising:
determining occurrence of a sudden power-off in a memory device that includes a memory cell array including a plurality of scan areas, each of the plurality of the scan areas including at least two group areas, each including plural pages and a single flag area for storing a flag that represents whether the plural pages of each of the group areas are programmed or not, wherein the flag is set when a program operation onto the plural pages of each of the group areas is completed;
receiving flags for the group areas from the memory device when a power supply is resumed after the sudden power-off;
searching which flag is in an erase state; and
starting a rebuilding operation from at least one of the group areas, which includes an erase-state flag,
wherein the starting the rebuilding operation includes scanning only the group area at which the program operation stopped among the plurality of scan areas so as to reduce the time taken for a rebuild operation.

12. The method of claim 11, wherein the plurality of the scan areas of the memory cell array are blocks, and each of the blocks includes the group areas.

13. The method of claim 12, wherein the single flag area of each of the group areas is disposed in a last word line of the group.

14. The method of claim 12, further comprising:
when a program operation performed onto a scan area is completed for one of the group areas, programming the flag for the group for which the program operation is completed.

15. The method of claim 14, wherein the receiving of the flags for the group areas from the memory device when the power supply is resumed after the sudden power-off includes:
searching for an open block included in the memory device where the program operation stopped, when the power supply is resumed after the sudden power-off; and
reading the flags of the searched open block.

16. The method of claim 15, wherein the rebuilding of the group corresponding to the erase-state flag among the read flags includes:
determining whether the flags are in a program state or an erase state;
determining a program state of the group corresponding to a first erase-state flag among the flags; and
rebuilding the group corresponding to the first erase-state flag.

17. The method of claim 16, wherein the determining of the program state of the group corresponding to the erase-state flag among the read flags further includes:
not scanning groups corresponding to programmed flags among the received flags.

18. The method of claim 16, further comprising:
programming data continuously from a position that is programmed lastly in the open block, after the rebuilding of the group corresponding to the erase-state flag among the read flags.

19. The method of claim 13, further comprising:
determining the occurrence of the sudden power-off through the memory device including the sudden power-off sensing circuit,
wherein the determining of the occurrence of the sudden power-off through the memory device including the sudden power-off sensing circuit includes:
requesting to transfer a sudden power-off sensing command to the memory device; and
determining the occurrence of the sudden power-off by reading a sudden power-off sensing data that is received from the memory device.

20. The method of claim 13, further comprising:
determining the occurrence of the sudden power-off in a host device, wherein the memory system is a Solid-State Drive (SSD).

* * * * *